(12) United States Patent
Tsukihara et al.

(10) Patent No.: US 9,449,791 B2
(45) Date of Patent: Sep. 20, 2016

(54) BEAM IRRADIATION APPARATUS AND BEAM IRRADIATION METHOD

(71) Applicant: Sumitomo Heavy Industries Ion Technology Co., Ltd., Tokyo (JP)

(72) Inventors: Mitsukuni Tsukihara, Ehime (JP); Noriyasu Ido, Ehime (JP); Noriyuki Suetsugu, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/736,928

(22) Filed: Jun. 11, 2015

(65) Prior Publication Data

US 2015/0364297 A1    Dec. 17, 2015

(30) Foreign Application Priority Data

Jun. 13, 2014  (JP) .................................. 2014-122347

(51) Int. Cl.
*H01J 37/302* (2006.01)
*H01J 37/304* (2006.01)
*H01J 37/317* (2006.01)

(52) U.S. Cl.
CPC .......... *H01J 37/304* (2013.01); *H01J 37/3171* (2013.01); *H01J 2237/30455* (2013.01); *H01J 2237/31701* (2013.01)

(58) Field of Classification Search
USPC ......... 250/396 R, 397, 492.1, 492.2, 492.21, 250/492.22, 492.23, 492.3
See application file for complete search history.

(56) References Cited

U.S. PATENT DOCUMENTS

| | | | |
|---|---|---|---|
| 7,642,530 B2 | 1/2010 | Shibata et al. | |
| 2005/0041770 A1* | 2/2005 | Heismann | A61B 6/032 378/4 |
| 2005/0045821 A1* | 3/2005 | Noji | G01N 23/225 250/311 |
| 2011/0291010 A1* | 12/2011 | Katane | H01J 37/244 250/310 |
| 2012/0138805 A1* | 6/2012 | Missalla | G01J 1/0437 250/362 |

FOREIGN PATENT DOCUMENTS

| | | |
|---|---|---|
| JP | 2689137 B2 | 12/1997 |
| JP | 2005-056698 A | 3/2005 |
| JP | 2005-063874 A | 3/2005 |
| JP | 2005-285518 A | 10/2005 |
| JP | 4151703 B2 | 9/2008 |
| JP | 5057008 B2 | 10/2012 |

* cited by examiner

*Primary Examiner* — Nicole Ippolito
(74) *Attorney, Agent, or Firm* — Michael Best & Friedrich LLP

(57) ABSTRACT

Provided is a beam irradiation apparatus including: a beam scanner that is configured such that a charged particle beam is reciprocatively scanned in a scanning direction; a measurement device that is capable of measuring an angular component of charged particles incident into a region of a measurement target; and a data processor that calculates effective irradiation emittance of the charged particle beam using results measured by the measurement device. The measurement device measures a time dependent value for angular distribution of the charged particle beam. The data processor transforms time information included in the time dependent value for the angular distribution to position information and thus calculates the effective irradiation emittance. The effective irradiation emittance represents emittance of a virtual beam bundle, the virtual beam bundle being formed by summing portions of the charged particle beam which are incident into the region of the measurement target.

22 Claims, 17 Drawing Sheets

BEAM IRRADIATION APPARATUS AND BEAM IRRADIATION METHOD

RELATED APPLICATION

Priority is claimed to Japanese Patent Application No. 2014-122347, filed on Jun. 13, 2014, the entire content of which is incorporated herein by reference.

BACKGROUND OF THE INVENTION

1. Field of the Invention

The present invention relates to a beam irradiation apparatus and a beam irradiation method.

2. Description of the Related Art

In a semiconductor production process, an ion implantation process that is implanting ions to a semiconductor wafer is generally performed for the purpose of changing the conductivity of the semiconductor and/or the crystalline structure of the semiconductor. An apparatus that is used in the ion implantation process is called an ion implantation apparatus, and has a function of generating ions by ionization in an ion source and a function of forming an ion beam by acceleration and a function of transporting the ion beam to an implantation processing chamber and irradiating a wafer inside the processing chamber with the ion beam. The ion implantation apparatus is an example of abeam irradiation apparatus which is used to irradiate a processed object with a charged particle beam configured by charged particles such as ions or electrons.

An index representing a state of convergence or divergence of a charged particle beam with respect to a traveling direction is called "Emittance". For example, the emittance is provided by x–θ distribution in which a position x in a plane perpendicular to a beam trajectory and an angle θ between a traveling direction of charged particles at the position x and the beam trajectory are plotted on an x–θ plane. For example, an ion beam is limited by a small hole and emission of light generated by incidence of the beam passing through the small hole on a fluorescent screen is measured by an image sensor, so that an incident angle or emittance of the ion beam is measured.

When the angle of the ion beam incident on the wafer is changed, the form of interaction between the ion beam and the wafer is changed, which is known to affect processing results of the ion implantation. Accordingly, in order to appropriately control the ion implantation process, it is required to comprehend angle information of the ion beam. In certain, in order to evaluate quality of the ion implantation process with respect to the entire wafer, it is important to know how much ion irradiation is performed on each point of the wafer at individual incident angles. In other words, instead of measuring angle information on the ion beam with which the wafer is irradiated, when seen from a point on the wafer, measurement of angle information on ions incident into the point is required.

SUMMARY OF THE INVENTION

The invention is made in view of such circumstances, and an object thereof is to provide a technique for improving quality of beam irradiation processing.

A beam irradiation apparatus according to an aspect of the invention is configured to irradiate a processing object with a charged particle beam, including: a beam scanner that is configured such that a charged particle beam is reciprocatively scanned in a predetermined scanning direction; a measurement device that is capable of measuring an angular component of charged particles incident into a region of a measurement target; and a data processor that calculates effective irradiation emittance of the charged particle beam using results measured by the measurement device. The measurement device measures a time dependent value for angular distribution of the charged particle beam for a period in which the charged particle beam to be reciprocatively scanned in the scanning direction passes over the region of the measurement target and is incident on the measurement device. The data processor transforms time information included in the time variation value for the angular distribution measured by the measurement device to position information and thus calculates the effective irradiation emittance. The effective irradiation emittance represents an emittance of a virtual beam bundle in the scanning direction, the virtual beam bundle being formed by summing portions of the charged particle beams which are incident into the region of the measurement target with being scanned in the scanning direction.

Another aspect of the invention is a beam irradiation method. The method is a beam irradiation method of irradiating a processing object with a charged particle beam, including: scanning the charged particle beam reciprocatively in a predetermined scanning direction; measuring time dependent value for angular distribution of the charged particle beam, by using a measurement device capable of measuring an angular component of charged particles incident into a region of a measurement target, for a period in which the charged particle beam to be reciprocatively scanned in the scanning direction passes over the region of the measurement target and is incident into the measurement device; and transforming time information included in the measured time variation value for the angular distribution to position information and calculating effective irradiation emittance of the charged particle beam. The effective irradiation emittance represents emittance of a virtual beam bundle in the scanning direction, the virtual beam bundle being formed by summing portions of the charged particle beam which are incident into the region of the measurement target with being scanned in the scanning direction.

Optional combinations of the aforementioned constituting elements, and implementations of the invention in the form of methods, apparatuses, and systems, may also be practiced as additional modes of the present invention.

DETAILED DESCRIPTION OF THE INVENTION

Figure 1:
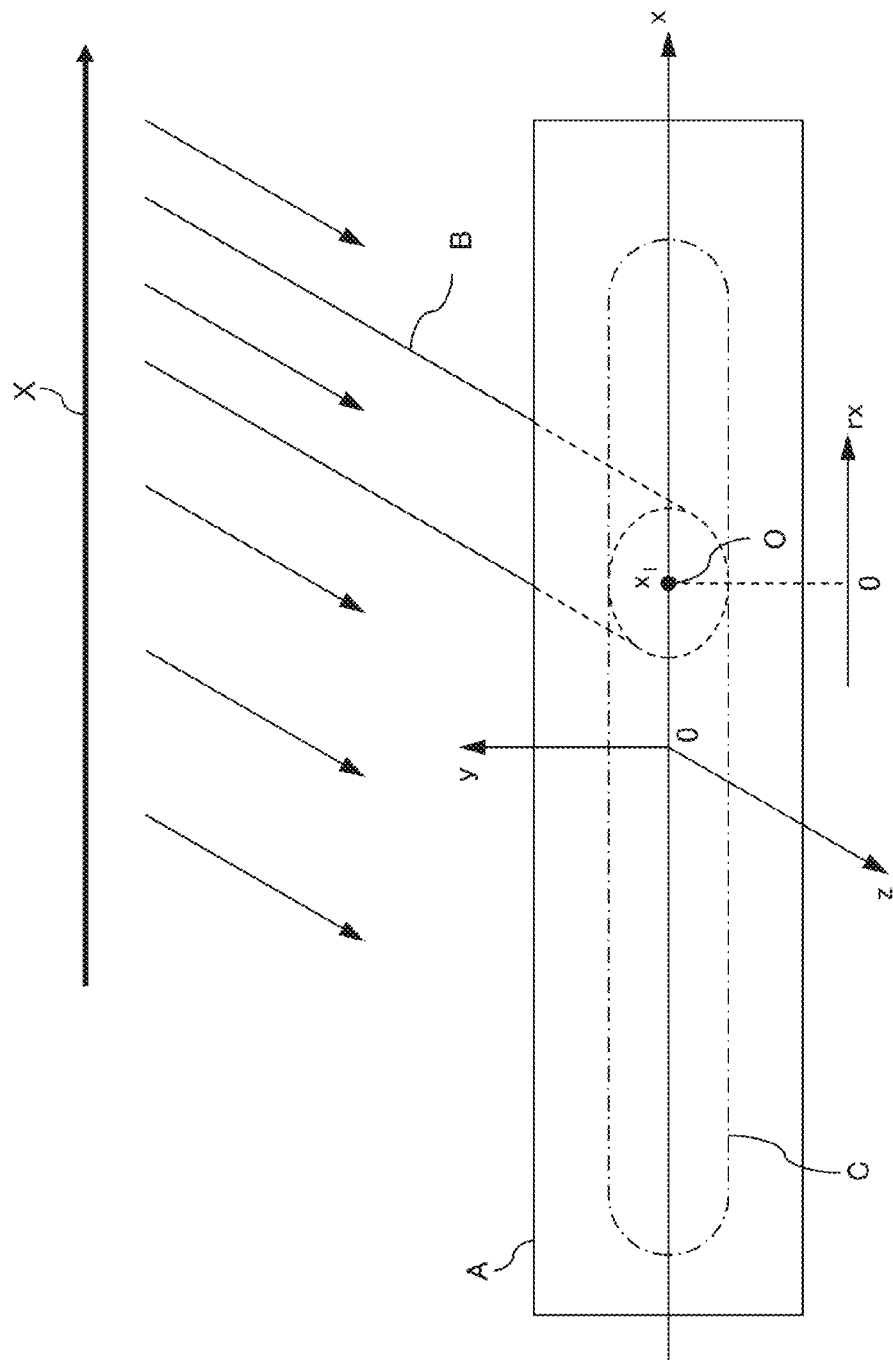
FIG. 1 is a diagram that schematically illustrates a state where a charged particle beam to be scanned is incident on an irradiation plane of a processing object.

The invention will now be described by reference to the preferred embodiments. This does not intend to limit the scope of the present invention, but to exemplify the invention.

Hereinafter, embodiments of the present invention will be described in detail with reference to the drawings. The same reference sign will be assigned to the same element in the drawings, and duplicate description thereof will not be presented as an appropriate. The configurations described below are merely examples but are not for purposes of limiting the scope of the present invention.

The outline of the invention will be described prior to the description of the embodiment. A beam irradiation apparatus according to the embodiment includes a beam scanner that is configured such that a charged particle beam is reciprocatively scanned; a measurement device that is capable of measuring an angular component of charged particles incident on a region of a measurement target; and a data processor that calculates effective irradiation emittance of the charged particle beam using results measured by the measurement device. The measurement device measures a time dependent value for angular distribution of the charged particle beam for a period in which the charged particle beam to be reciprocatively scanned in the scanning direction passes over the region of the measurement target and is incident on the measurement device. The data processor transforms time information included in the time variation value for the angular distribution measured by the measurement device to position information and thus calculates the effective irradiation emittance.

In the embodiment, "effective irradiation emittance" is calculated as an index for evaluating angle information of the charged particle beam incident into a certain region on a surface of a processed object. Here, the effective irradiation emittance represents an emittance of a virtual beam bundle formed by summing portions of the charged particle beam which are incident into a certain region with being scanned in a scanning direction. For example, when a spot-like charged particle beam is irradiated while being reciprocatively scanned, the certain portions of the charged particle beam to be scanned are incident into the certain region of the processing object, and an angular component of the portion of the beam incident on the region varies with the change of the beam position due to the scanning. The varying portions of the beam are continuously joined to each other and a virtual beam bundle incident into the certain region is assumed, so that an emittance of the beam bundle is obtained as "effective irradiation emittance".

In general, when an angle of the charged particle beam incident on the processing object is changed, the form of the interaction between the charged particle beam and the processed object is also changed, which can affect results of irradiation processing. Accordingly, in order to appropriately control a beam irradiation processing, it is required to comprehend angle information of the charged particle beam. In the embodiment, the "effective irradiation emittance" is obtained, and thus the charged particle beam used for the beam irradiation processing is more appropriately evaluated to improve the quality of the beam irradiation processing.

First, the concept of the effective irradiation emittance will be described with reference to FIGS. 1 to 5.

FIG. 1 is a diagram that schematically illustrates a state where a charged particle beam B to be scanned is incident into an irradiation plane A of the processing object. The charged particle beam B having a spot-like cross section is scanned in a direction indicated by an arrow X and is incident into the irradiation plane A of the processed object in a scanning range C. For convenience of description in this specification, a traveling direction of the charged particle beam B on design is defined as a z direction and a plane perpendicular to the z direction is defined as an xy-plane. In addition, when the charged particle beam B is scanned, a scanning direction of the beam is defined as an x direction and a direction perpendicular to both the z direction and the x direction is defined as a y direction.

Furthermore, an x-coordinate system applying a position in the irradiation plane A as a reference and an rx-coordinate system applying a beam center O of the charged particle beam B as an origin are used with respect to the scanning direction of the beam. The x-coordinate system is mainly used to indicate the beam position of the charged particle beam B to be scanned, and the rx-coordinate system is used to indicate the angle information of the charged particle beam. FIG. 1 illustrates a state where the beam center O of the charged particle beam B is located at a position $x_1$ in the x-coordinate system and the origin of the rx-coordinate system is the position $x_1$ at this time.

Figure 2:
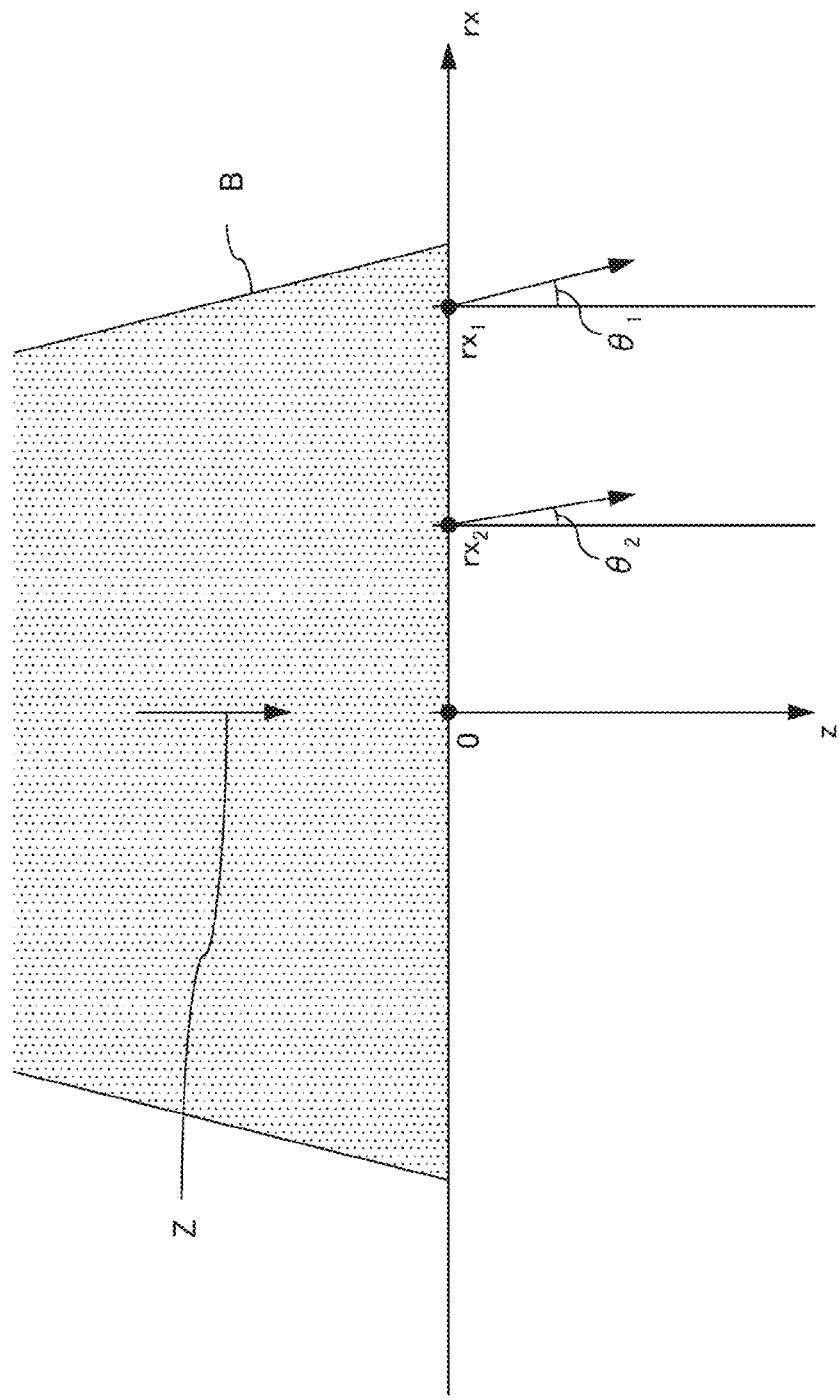
FIG. 2 is a diagram that schematically illustrates angular components of charged particles constituting the charged particle beam.

FIG. 2 is a diagram that schematically illustrates angular components of charged particles constituting the charged particle beam B. The charged particle beam B traveling in a direction indicated by an arrow Z is mainly formed by a charged particle group traveling in the z direction and travels in the z direction as a whole. However, all of the charged particles constituting the charged particle beam B do not travel in the z direction, but each of the charged particles has a specific traveling direction. As illustrated in FIG. 2, in the case of the charged particle beam B spreads according to the traveling of the beam, the ratio of the charged particles traveling along a z-axis may be higher in the vicinity of the origin of the rx-coordinate system corresponding to the beam center. Meanwhile, the ratio of the charged particles traveling in a direction inclined by $\theta_1$ toward the x-direction from the z-axis may be higher in a position $rx_1$ located away from the beam center and the ratio of the charged particles traveling in a direction inclined by $\theta_2$ toward the x-direction from the z-axis may be higher in a position $rx_2$ located between the beam center and the position rx. In this way, each of the charged particles constituting the charged particle beam B can have an angular component corresponding to the position rx.

Figure 3:
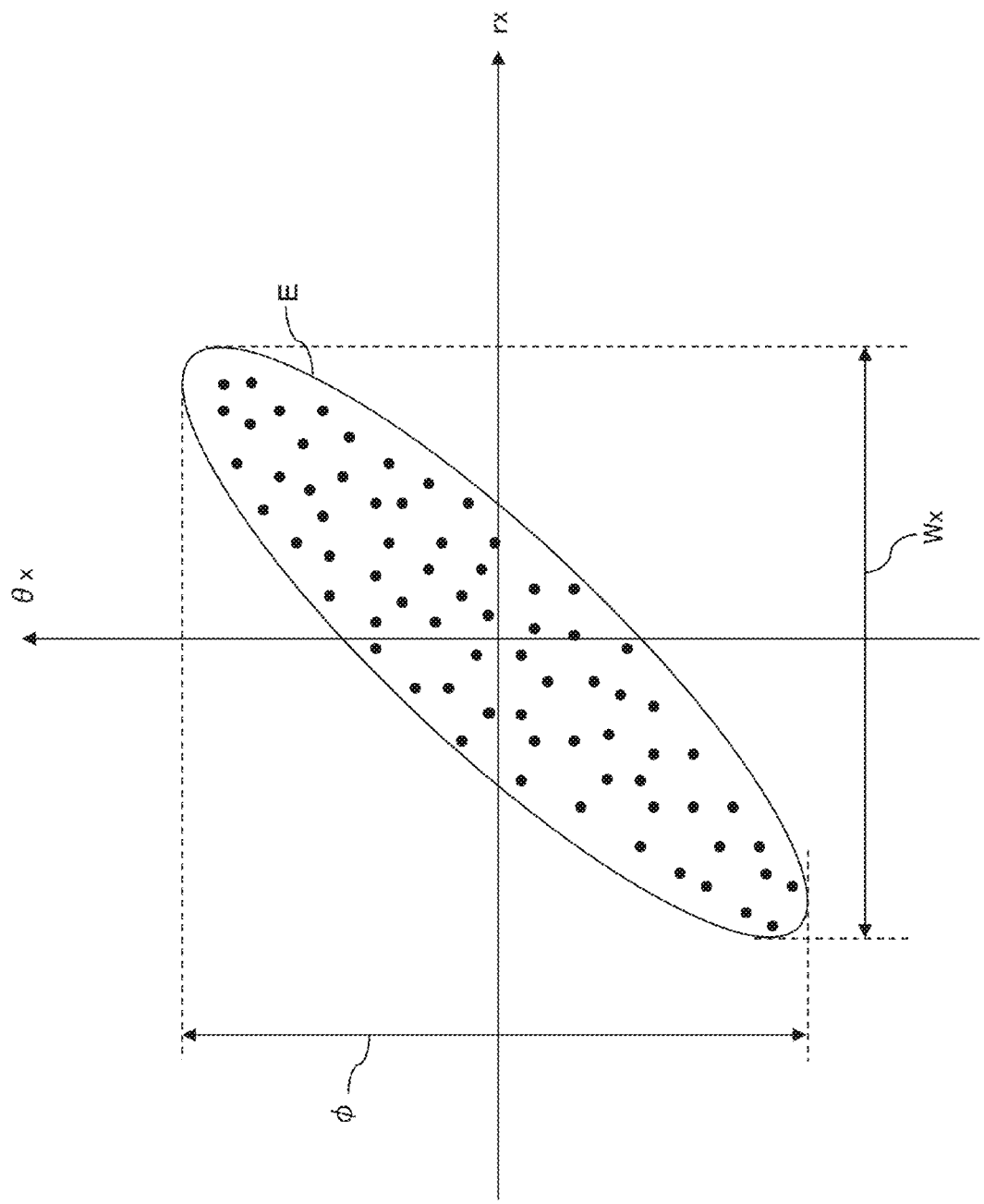
FIG. 3 is a graph that illustrates an example of angular distribution of the charged particle beam.

FIG. 3 is a graph that illustrates an example of angular distribution of the charged particle beam and this graph illustrates a relation between the position rx and the angle $\theta x$ which are described above. The angles $\theta x$ of the charged particles have a certain width in each position rx. By plotting the relation between the position rx and the angle $\theta x$ shown by each of the charged particles, an outline of a range E occupied by the plotted points will be obtained. A width Wx of the range E in the rx-direction corresponds to the beam diameter in the x-direction and a width $\phi$ in the $\theta x$ direction corresponds to a spread angle of the beam. In addition, an area value of the range E is called "emittance". In general, the "emittance" is used to represent the area value of the range E, but the term "emittance" in this specification is also used as a term which represents the shape of the range E or the relationship between the position rx and the angle $\theta x$ indicated by the range E as an extended interpretation.

By measurement of the "emittance", angular characteristics of the charged particle beam can be grasped and the angular components of the charged particles incident into a point where the charged particle beam is irradiated can be evaluated. For example, in the case of irradiating the processing object with a charged particle beam not being scanned for which the position of the beam center is stationary, angular distribution of a charged particle group incident on a certain point is grasped from the emittance illustrated in FIG. 3. Meanwhile, when the charged particle beam is scanned, since a positional relation between the certain point and the beam center varies with the lapse of time, it is necessary to take into account the positional relation so as to accurately grasp the angular distribution of the charged particle group incident into the certain point.

Figure 4:
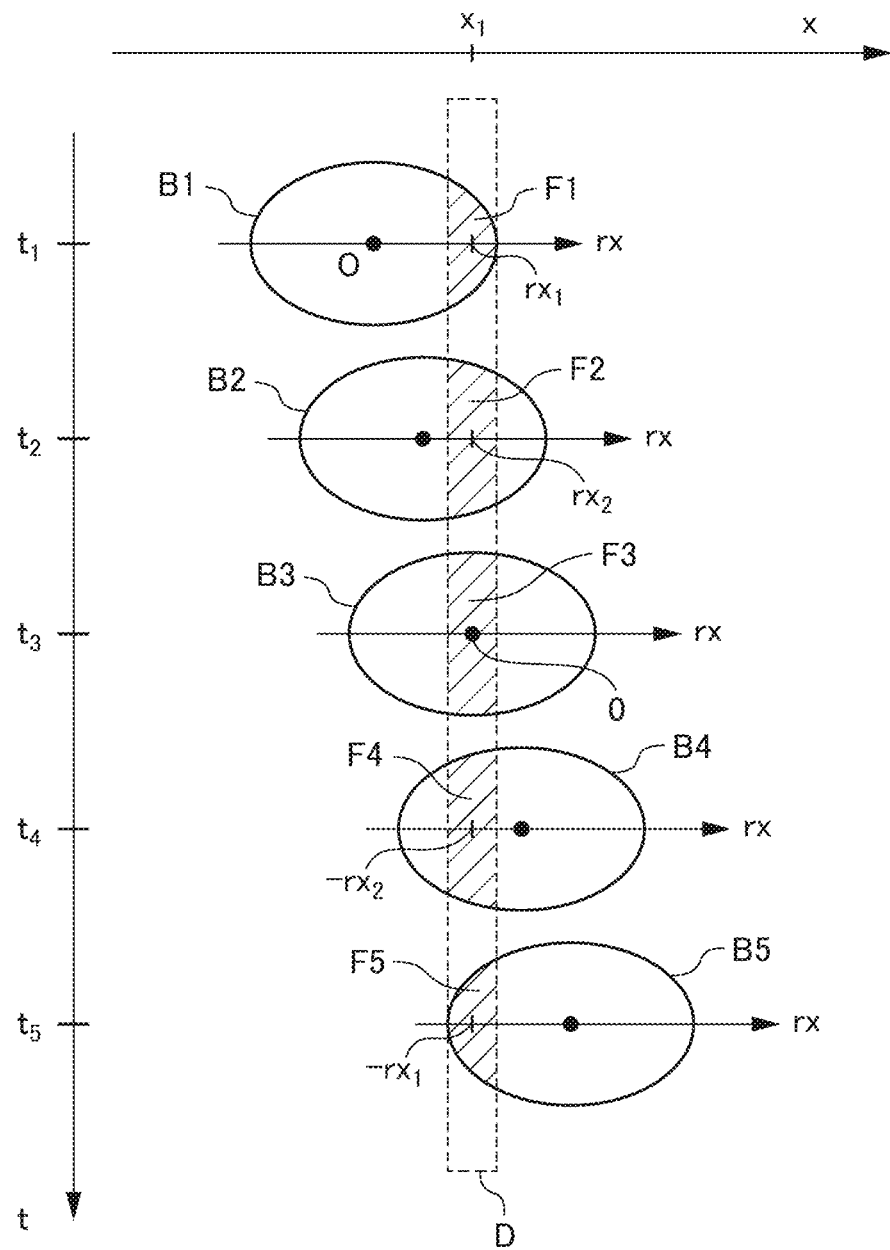
FIG. 4 is a diagram that schematically illustrates a state where the charged particle beams to be scanned are incident into a micro region.

FIG. 4 is a diagram that illustrates a state where charged particle beams B1 to B5 to be scanned are incident into a micro region D. In this drawing, with respect to the charged particle beams to be scanned in a +x-direction with the lapse of time, irradiation positions of the charged particle beams B1 to B5 in times $t_1$ to $t_5$ are illustrated respectively. Beam centers O of the charged particle beams B1 to B5 move to the +x-direction and a radial position rx of a portion of the beam incident into a position $x_1$ at which a micro region D is located will vary. As a result, charged particles constituting portion F1 of the beam B1 located near the radial position $rx_1$ are incident into the micro region D at time $t_1$. Similarly, portion F2 of the beam B2 located near the radial position $rx_2$ is incident into the micro region D at time $t_2$ and portion F3 of the beam B3 located near the origin of the radial position is incident into the micro region D at time $t_3$. Moreover, portion F4 of the beam B4 located near the radial position $-rx_2$ is incident into the micro region D at time $t_4$ and portion F5 of the beam B5 located near the radial position $-rx_1$ is incident into the micro region D at time $t_5$.

Assuming that the emittances of the charged particle beams B1 to B5 having different beam positions x are not changed at all, the angular characteristics of the charged particle group incident into the micro region D may be represented by the emittance of these charged particle beams. However, when the position x of the beam is changed by scanning, the emittances of the charged particle beams may vary due to, for example, an influence of an electric field or a magnetic field applied by the beam scanner or a difference in traveling path of the beam from the beam scanner to the irradiation plane A. When the emittances of the charged particle beams B1 to B5 vary depending on the position x of the beam, the angular characteristics of the charged particle group incident into the micro region D may not be represented by any of the emittances of the charged particle beams B1 to B5 to be scanned. Here, in order to represent the angular characteristics of the charged particle group incident into the micro region D more accurately, a concept of "virtual beam bundle" is introduced into the embodiment.

Figure 5:
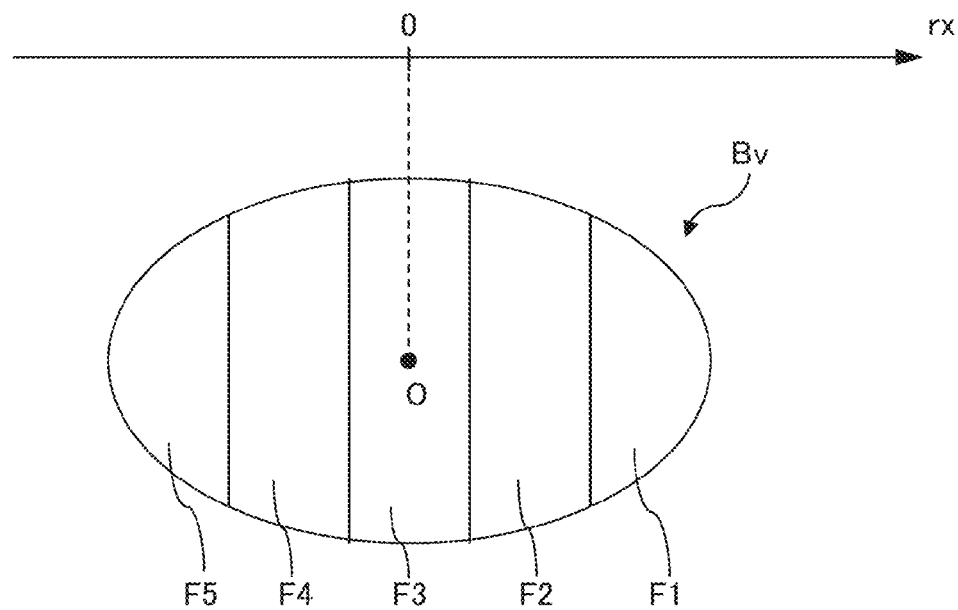
FIG. 5 is a diagram that schematically illustrates a virtual beam bundle incident into the micro region.

FIG. 5 is a diagram that schematically illustrates the virtual beam bundle By incident into the micro region D, and the virtual beam bundle is obtained by summing portions F1 to F5 of the charged particle beams B1 to B5 illustrated in FIG. 4. FIGS. 4 and 5 illustrate a case where the virtual beam bundle is divided into five portions by using the discretely elapsed times $t_1$ to $t_5$ as an example, but the "virtual beam bundle Bv" is actually formed by summing portions of the charged particle beam incident into the micro region D every time where minute time dt elapses.

In the micro region D, a result obtained by irradiating with the virtual beam bundle Bv to be scanned coincides with a result obtained by irradiating with the charged particle beams B1 to B5 in which the emittances are different depending on the position x. Therefore, if the emittance of the virtual beam bundle Bv can be calculated, the angular characteristics of the charged particle group incident into the micro region D can be more accurately represented. In the embodiment, the emittance of the virtual beam bundle Bv is called "effective irradiation emittance" as an emittance represented from the viewpoint of an object to be irradiated. By obtaining the "effective irradiation emittance", it is possible to more appropriately evaluate the angular characteristics of the charged particle group incident on the micro region D and to improve the quality of the beam irradiation processing.

Figure 6:
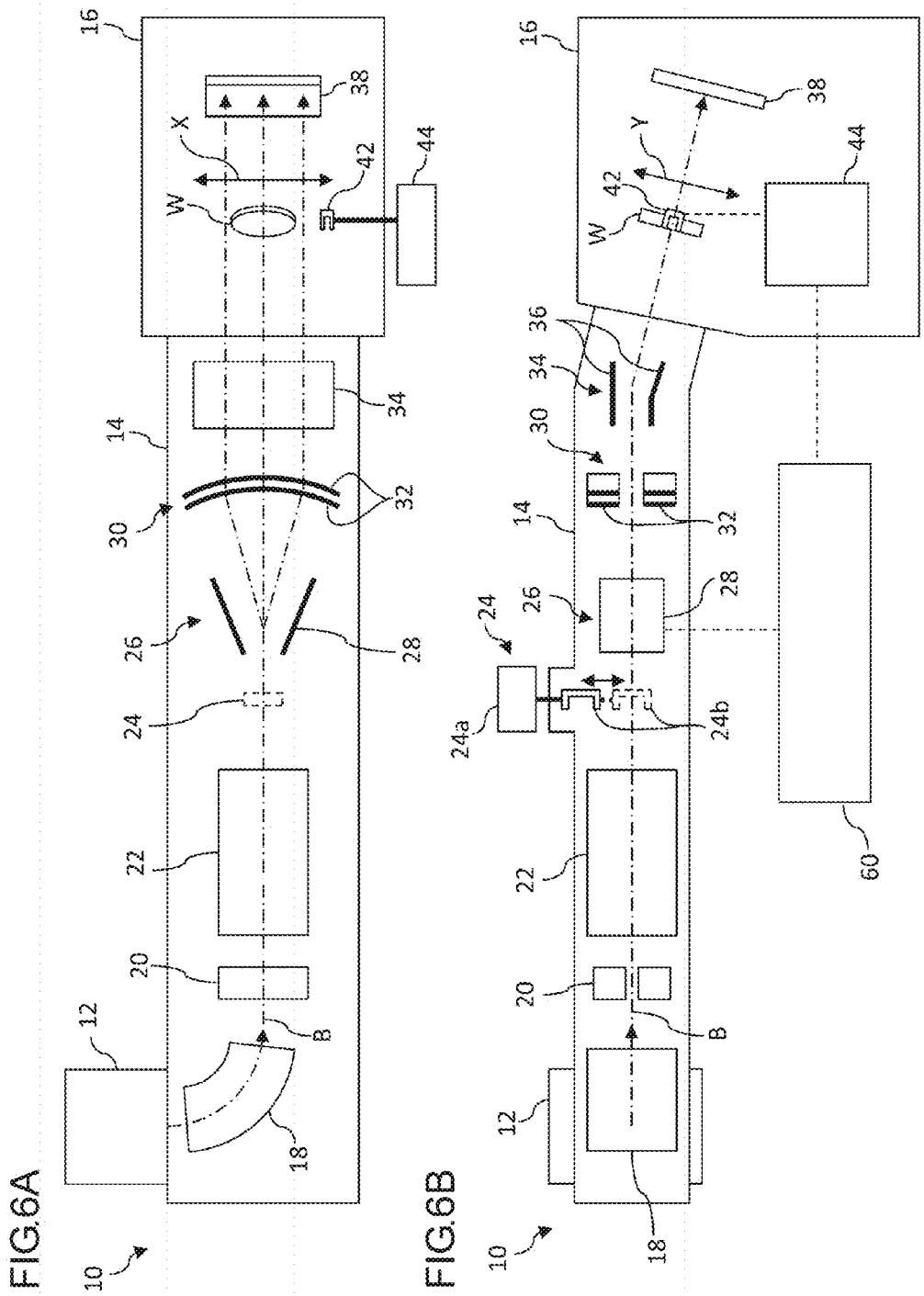
FIG. 6A is a top view that illustrates a schematic configuration of a beam irradiation apparatus according to an embodiment.
FIG. 6B is a side view that illustrates the schematic configuration of the beam irradiation apparatus according to the embodiment.

Subsequently, a beam irradiation apparatus 10 according to an embodiment will be described. FIGS. 6A and 6B are schematic diagrams that illustrate the beam irradiation apparatus 10 according to the embodiment. FIG. 6A is a top view that illustrates a schematic configuration of the beam irradiation apparatus 10, and FIG. 6B is a side view that illustrates a schematic configuration of the beam irradiation apparatus 10.

The beam irradiation apparatus 10 is configured to irradiate a surface of a processing object W with a charged particle beam. The beam irradiation apparatus 10 according to the embodiment is a beam irradiation apparatus configured to perform an ion implantation processing for the processing object W. The processing object W, for example, is a substrate such as a semiconductor wafer. Thus, hereinafter, for the convenience of description, the processing object W may be referred to as a wafer W, but it does not intend to limit the target of the implantation processing to a specific object. Furthermore, the beam irradiation apparatus 10 is an ion implantation apparatus in the embodiment, but may be configured as a beam irradiation apparatus to irradiate with charged particles such as electrons other than ions in another embodiment.

The beam irradiation apparatus 10 is configured to irradiate the entire wafer W with a charged particle beam B by a reciprocatory scanning of the beam and a reciprocatory movement of the wafer W. In a case where the processing object W is scanned using the charged particle beam B, the reciprocatory scanning of the beam is performed in a direction indicated by an arrow X and the reciprocatory movement of the wafer W is performed in a direction indicated by an arrow Y.

The beam irradiation apparatus 10 includes an ion source 12, a beamline device 14, and an implantation processing chamber 16. The ion source 12 is configured to supply the charged particle beam B to the beamline device 14. The beamline device 14 is configured to transport charged particles from the ion source 12 to the implantation processing chamber 16. In addition, the beam irradiation apparatus 10 includes a vacuum pumping system (not illustrated in the figure) that is used for providing a desired vacuum environment for the ion source 12, the beamline device 14, and the implantation processing chamber 16.

The beamline device 14 includes, for example, a mass analyzing unit 18, a variable aperture 20, a beam focusing unit 22, a beam measurement unit 24, a beam scanner 26, a parallelizing lens 30 or a beam collimating device, and an AEF (Angular Energy Filter) 34 in this order from the upstream side. Here, the upstream side of the beamline device 14 indicates a side closer to the ion source 12, and the downstream side thereof indicates a side closer to the implantation processing chamber 16 (or a beam stopper 38).

The mass analyzing unit 18 is provided at the downstream side of the ion source 12, and is configured to select a necessary ion species from a charged particle beam extracted out from the ion source 12 by a mass analyzing function. The variable aperture 20 is an opening-width adjustable aperture and beam intensity of the charged particle beam B passing through the aperture is modified by a change of the opening width. The beam focusing unit 22 includes a focusing lens such as a quadrupole focusing device (Q lens) and is configured such that the charged particle beam B that has passed through the variable aperture 20 is focused and thus shaped into a desired cross-section.

The beam measurement unit 24 is an injector flag faraday cup which is disposed so as to move into and out of the beamline and measures intensity or current of the charged particle beam. The beam measurement unit 24 includes a faraday cup 24b which measures a beam current and a drive unit 24a which moves the faraday cup 24b up and down. As indicated by the dashed line of FIG. 6B, the charged particle beam B is interrupted by the faraday cup 24b when the faraday cup 24b is disposed on the beamline. Meanwhile, as indicated by the solid line of FIG. 6B, the interruption of the charged particle beam B is canceled when the faraday cup 24b is get out of the beamline.

The beam scanner 26 is configured to provide reciprocatory scanning of the beam and is a deflecting apparatus that performs scanning of the shaped charged particle beam B in the x direction. The beam scanner 26 includes a pair of scanner electrodes 28 which are disposed so as to face from each other in the x direction. The scanner electrodes 28 are connected to variable voltage supplies (not illustrated). Here, when the voltages applied to the pair of scanner electrodes 28 are periodically changed, an electric field formed between the electrodes is changed so as to periodically deflect the charged particle beam B. In this way, the charged particle beam B is scanned across an x-directional scanning range. In FIG. 6A, a beam scanning direction and the scanning range thereof are denoted by arrow X as an example, and plural trajectories of the charged particle beams B at the scanning range are respectively denoted by the one-dotted chain line. The beam scanner 26 may be a magnetic-type deflecting apparatus that performs scanning of the charged particle beam by applying a magnetic field.

The parallelizing lens 30 is configured to cause the traveling directions of the scanned charged particle beam B to be parallel to each other. The parallelizing lens 30 includes a plurality of arc-shaped P-lens electrodes 32 having a charged particle beam passage slits at the center portion thereof. The P-lens electrodes 32 are connected to high-voltage power supplies (not illustrated), and arranges the traveling direction of the charged particle beam B in parallel by exerting the electric field generated by the application of the voltage to the charged particle beam B.

The angular energy filter (AEF) 34 analyzes the energy of the charged particle beam B, deflects the charged particles having the necessary energy downward, and leads the charged particles to the implantation processing chamber 16. The angular energy filter 34 includes a pair of AEF electrodes 36 which use an electric field for the beam deflection. High-voltage power supplies (not illustrated) are connected to the pair of AEF electrodes 36. In FIG. 6B, a positive voltage is applied to the upper AEF electrode and a negative voltage is applied to the lower AEF electrode, so that the charged particle beam B is deflected downward. The angular energy filter 34 may include a deflection magnet that exerts a magnetic field for the beam deflection and may include a combination of the AEF electrodes 36 and the deflection magnet.

In this way, the beamline device 14 supplies the charged particle beam B to be irradiated to the wafer W to the implantation processing chamber 16.

The implantation processing chamber 16 holds one or a plurality of wafers W and includes a reciprocatory movement apparatus 40 (see FIG. 7) configured to provide relative movement (for example, y-direction) with respect to the charged particle beam B for the wafer W as is necessary. In FIGS. 6A and 6B, the reciprocatory movement of the wafer W is denoted by arrows Y as an example. In addition, the implantation processing chamber 16 includes the beam stopper 38. In a case where the wafer W is not present on the trajectory of the beam, the charged particle beam B is incident on the beam stopper 38.

The implantation processing chamber 16 is provided with a measurement device 42 which measures intensity or angular distribution of the charged particle beam B on the surface of the wafer W. The measurement device 42 is configured to be movable in the X direction by a driving apparatus 44. For example, the measurement device 42 is retreated so as not to interfere with the wafer at the time of the ion implantation and is inserted into the irradiation range of the charged particle beam B when the wafer W is not present in the irradiation position. The measurement device 42 measures the intensity and the angular distribution of the charged particle beam B while moving in the X direction and measures intensity distribution and time dependent value for angular distribution of the charged particle beam B in the beam scanning direction. The values measured by the measurement device 42 are transmitted to the control device 60.

The control device 60 controls the operations of the components of the beam irradiation apparatus 10. The control device 60 generates a control waveform for the reciprocatory scanning of the charged particle beam B, outputs the generated control waveform to the beam scanner 26, and adjusts scanning speed distribution and/or scanning cycle of the charged particle beam B. In addition, the control device 60 acquires the intensity and/or the time variation value for the angular distribution of the charged particle beam B measured by the measurement device 42, and calculates and outputs various indices for evaluating qualities of the charged particle beam B such as the effective irradiation emittance.

Figure 7:
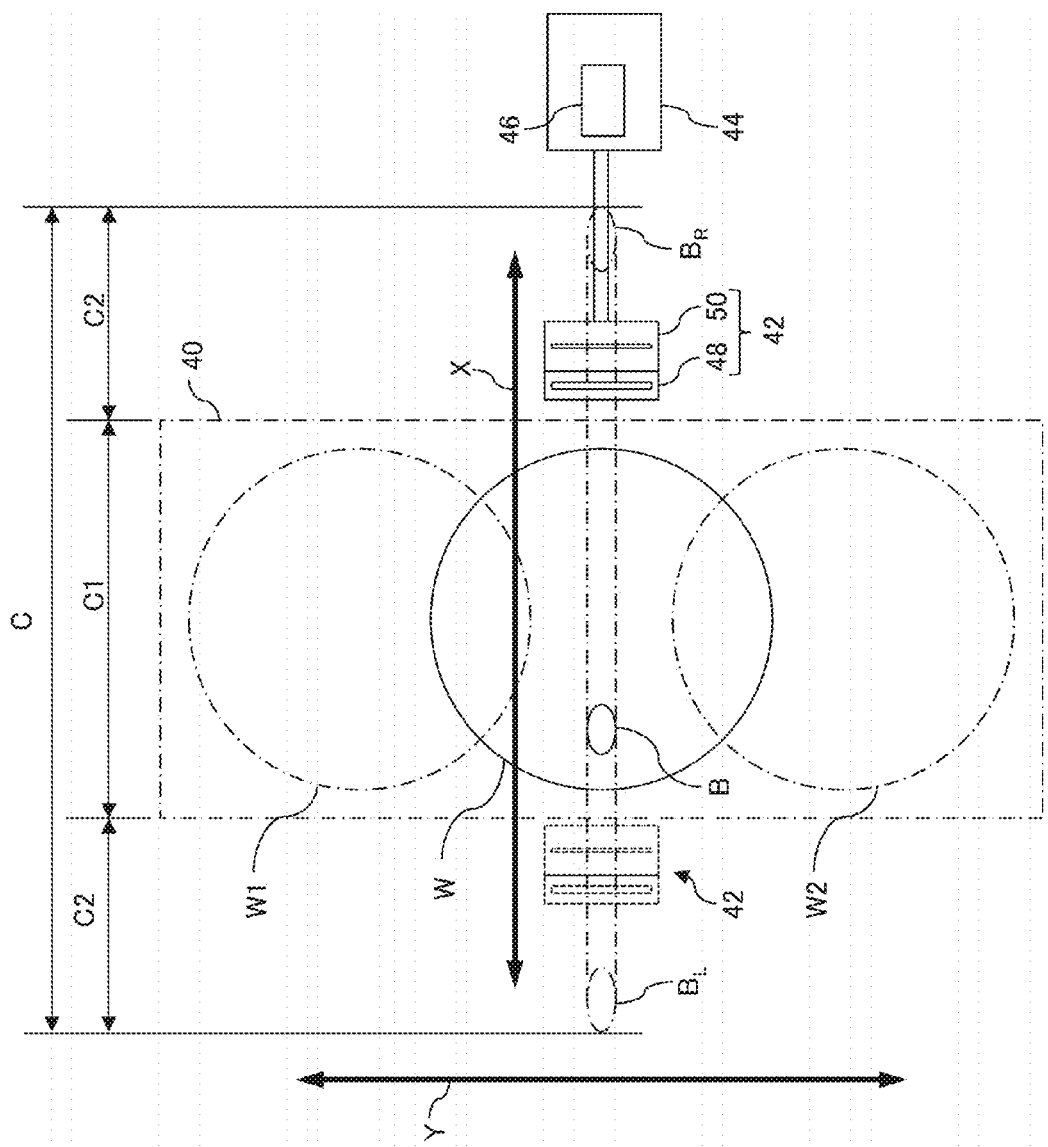
FIG. 7 is a front view that schematically illustrates a relation between a wafer to be reciprocatively moved and a beam to be reciprocatively scanned.

FIG. 7 is a front view that illustrates a relation between a wafer W to be reciprocatively moved and a charged particle beam B to be reciprocatively scanned. In FIG. 7, the charged particle beam B is reciprocatively scanned in a horizontal direction (X direction) and the wafer W is held in a reciprocatory movement apparatus 40 and reciprocatively moves on the vertical direction (Y direction). In FIG. 7, an uppermost-positioned wafer W1 and a lowermost-positioned wafer W2 are illustrated and with the wafer positions an operation range of the reciprocatory movement apparatus 40 is illustrated.

In addition, with respect to the charged particle beam B to be scanned by the beam scanner, positions $B_L$ and $B_R$ of scanning ends of the charged particle beam B are illustrated and thus a scanning range C of the charged particle beam B is illustrated. The charged particle beam B is controlled such that an over-scanning of the charged particle beam B can be performed up to non-irradiation ranges C2, in which the wafer W is not irradiated with the charged particle beam B, across an irradiation range C1 in which the wafer W held on the reciprocatory movement apparatus 40 is disposed. FIG. 7 illustrates a state where the horizontally-long charged particle beam B is scanned, but the charged particle beam B may have a vertically long shape or an approximately circular shape.

In addition, FIG. 7 illustrates a measurement range of the measurement device 42 which is configured to be movable in the X direction. The measurement device 42 is configured to be measurable over at least the irradiation range C1. As illustrated in the drawing, the measurement device 42 may include an intensity detector 48 and an angle detector 50. The intensity detector 48 is mainly used to measure the intensity of the charged particle beam B, and is configured by a faraday cup for example. The angle detector 50 is mainly used to measure an angular distribution of the charged particle beam. B. Both the intensity detector 48 and the angle detector 50 are disposed such that a measurement position in the z direction is positioned at an irradiation plane A of the processing object.

In the embodiment, the intensity detector 48 and the angle detector 50 are juxtaposed with each other and moved in the x direction by a driving apparatus 44, so that the intensity and the angular distribution of the charged particle beam B can be simultaneously measured over the irradiation range C1. The driving apparatus 44 allows the measurement device 42 to move from one end of the irradiation range C1 to the other end thereof in about several seconds, preferably, about one or two seconds. This enables the intensity and emittance of the charged particle beam B throughout the entire irradiation range C1 to be measured within several seconds. In a modified example, the intensity detector 48 may be not provided and the angle detector 50 may also serve as an instrument for measuring the beam intensity.

The driving apparatus 44 may include a position detector 46 which is used to detect the position of the measurement device 42 in the x direction. The position detector 46 detects the position of the measurement device 42 which is moved in the x direction by the driving apparatus 44 and transmits the detected position information to a control device 60. By installing the position detector 46, information on the intensity and the angular distribution of the charged particle beam B to be measured by the measurement device 42 can be acquired in association with the detected position information.

Figure 8:
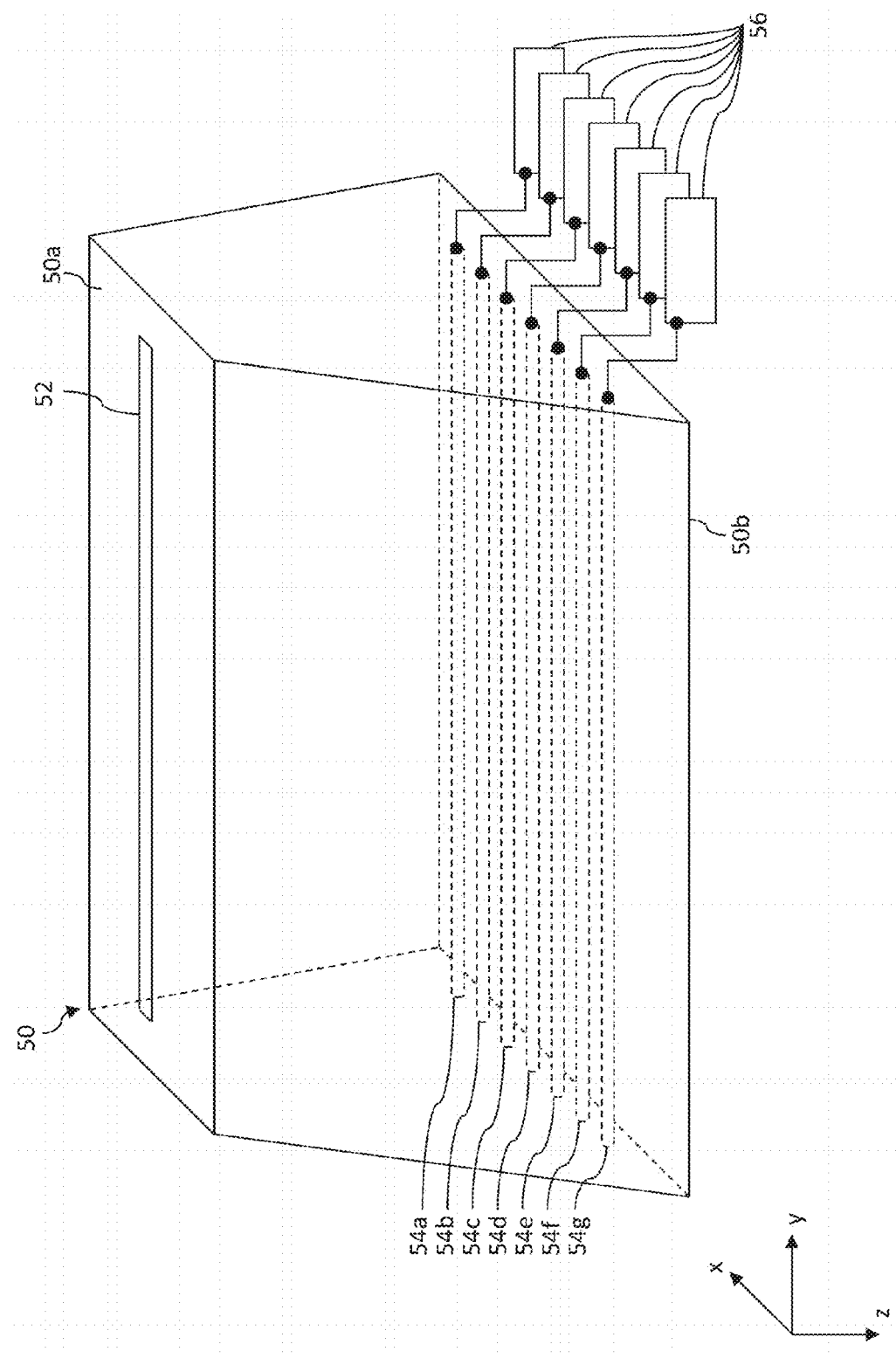
FIG. 8 is a perspective view that illustrates a schematic configuration of an angle detector.
Figure 9:
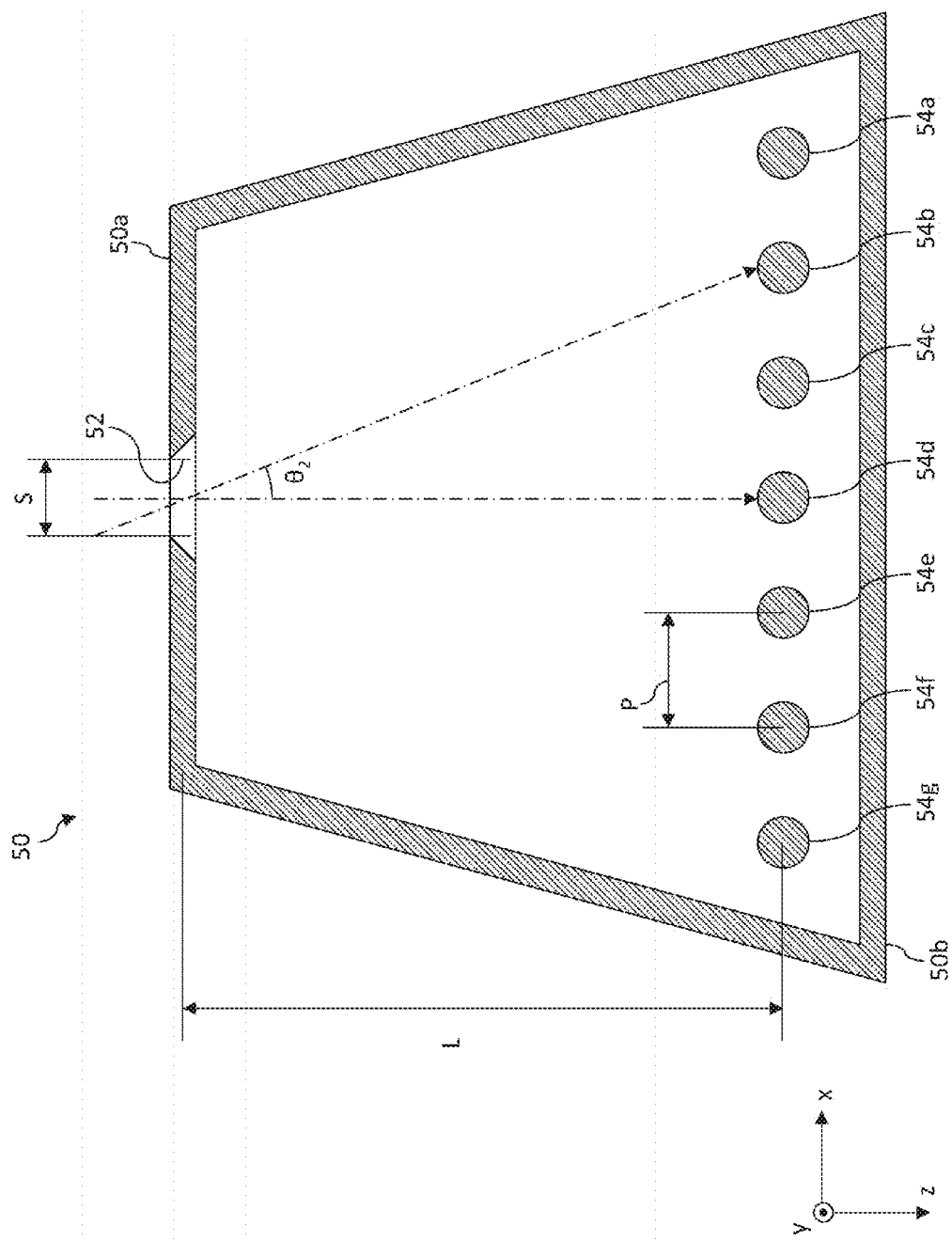
FIG. 9 is a cross-sectional view that illustrates the schematic configuration of the angle detector.

FIG. 8 is a perspective view that illustrates a schematic configuration of the angle detector 50, and FIG. 9 is a cross-sectional view that illustrates a schematic configuration of the angle detector 50. The angle detector 50 includes a slit 52 and a plurality of collector electrodes 54a to 54g (hereinafter, also referred collectively to as collector electrodes 54). The angle detector 50 is configured to detect an angular component θx of the charged particle incident into the slit 52 toward the scanning direction (x direction) regarding a beam traveling direction (z direction) as a standard.

The slit 52 is provided on a upper plate 50a of the angle detector 50 and has an opening which is narrow in the x direction and extended in the y direction. The slit 52 is formed such that a width S in the x direction becomes smaller than a beam diameter of the charged particle beam in the x direction and limits partial components to be measured from the whole beam having a predetermined size for partitioning region of a measurement target. The slit 52 has preferably a tapered shape in which the x-directional width thereof becomes wider in a +z direction so as not to interrupt the charged particle incident obliquely toward the collector electrodes 54 from the slit 52. Meanwhile, the y-directional width of the slit 52 is formed to become larger than the beam diameter of the charged particle beam in the y direction. Therefore, the whole of the charged particle beam becomes a measurement target in the y direction.

The collector electrodes 54 are a rod-like electrode body having a shape thin and extended in the y direction and is provided located away from the upper plate 50a, on which the slit 52 is provided, in the z direction. The plurality of collector electrodes 54a to 54g are provided spaced from one another at equal intervals in the x direction. In the embodiment, seven collector electrodes 54 are provided and three collector electrodes are each disposed at the right and left sides of the collector electrode 54d provided at a position opposite to the slit 52. The collector electrodes 54 are preferably provided longer than the slit 52 in the y direction to detect the whole of the charged particle group incident on the slit 52. The number and/or alignment of the collector electrodes 54 is merely exemplary, and the angle detector 50 may have the different number and/or different alignment of collector electrodes 54.

Each of the collector electrodes 54 detects a charged particles having angular components corresponding to a predetermined angle range. For example, a center value of angular components of a charged particles which are detected by the collector electrode 54b provided at a second position on the right side from the central collector electrode 54d satisfies a relation of $\theta_2$=arctan (2 P/L) when a z-directional distance between the slit 52 and the collector electrode 54 is designated as "L" and the intervals between the collector electrodes 54 are designated as "P". When being generalized, a center value $\theta_n$ of angular components of charged particles which are detected by the collector electrode provided at a n-th position from the central collector electrode 54d satisfies a relation of $\theta_n$=arctan (nP/L). In this way, each of the collector electrodes 54a to 54g detects charged particles having an angular components corresponding to a different angle range defined by a geometric alignment relation with the slit 52.

The angle detector 50 includes measurement circuits 56 which are connected to the plurality of collector electrodes 54a to 54g, respectively. The measurement circuit 56 detects a current generated when the charged particles are incident into the collector electrodes 54 and detects the angular distribution of the charged particle group incident into the slit 52 using a value of the current from each of the plurality of collector electrodes 54a to 54g. In addition, the measurement circuit 56 has a function of detecting a time dependent value of the current supplied from the collector electrode 54 for a predetermined measurement period. This enables the time variation value for the angular distribution of the charged particle group incident into the slit 52 to be measured. Moreover, the measurement circuit 56 may have a function of integrating the current supplied from the collector electrodes 54 for a measurement period and thus detecting integrated intensity of the angular distribution of the beam.

Figure 10:
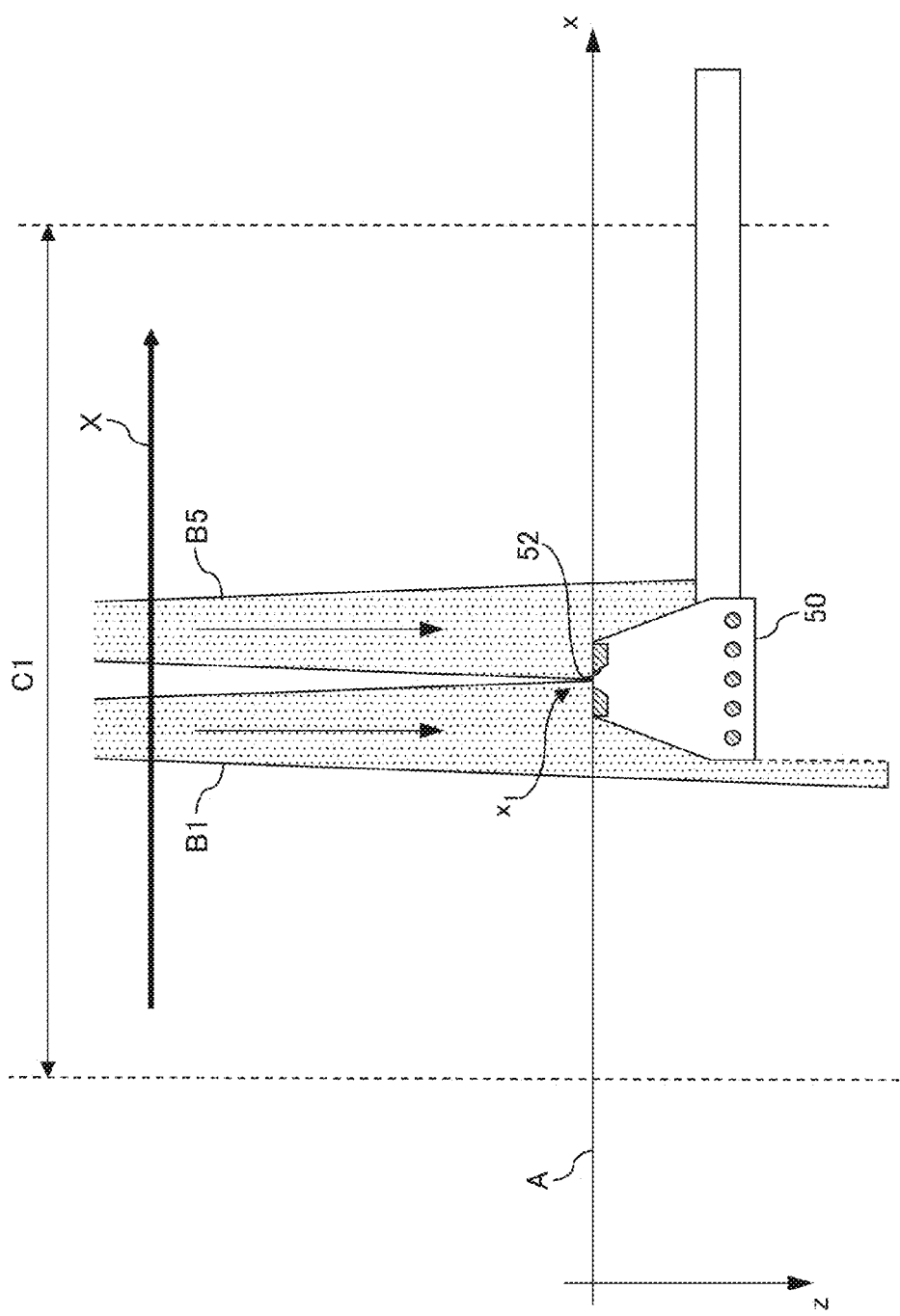
FIG. 10 is a diagram that schematically illustrates a state where edge portions of the charged particle beam to be scanned are incident into the angle detector.

FIG. 10 is a diagram that schematically illustrates a state where edge portions of the charged particle beam B to be scanned and incident into the angle detector 50. The angle detector 50 is disposed such that a z-directional front position of the slit 52 is the same position as the irradiation plane A of the wafer. The angle detector 50 is disposed such that the slit 52 is located at a position $x_1$, and the edge portion of charged particle beams B1 and B5 to be scanned in the X direction are incident into the slit 52. Since the x-directional width of the slit 52 is smaller than the beam diameter in the x direction, among the charged particle beam traveling toward the angle detector 50, only a part of the charged particles flying into the inside of the x-directional width of the slit 52 enter the angle detector 50. For example, in the case of the charged particle beam B1 where the center of the beam is on the left side from the position $x_1$, only a part of the charged particles located at the right side from the center of the beam are incident into the slit 52. Further, in the case of the charged particle beam B5 where the center of the beam is on the right side from the position $x_1$, only a part of the charged particles located at the left side from the center of the beam are incident on the slit 52. The angle detector 50 measures the time dependent value for the angular distribution of the charged particle beam over a period during which at least portions of the charged particle beams to be scanned in the X direction are incident on the slit 52.

Figure 11:
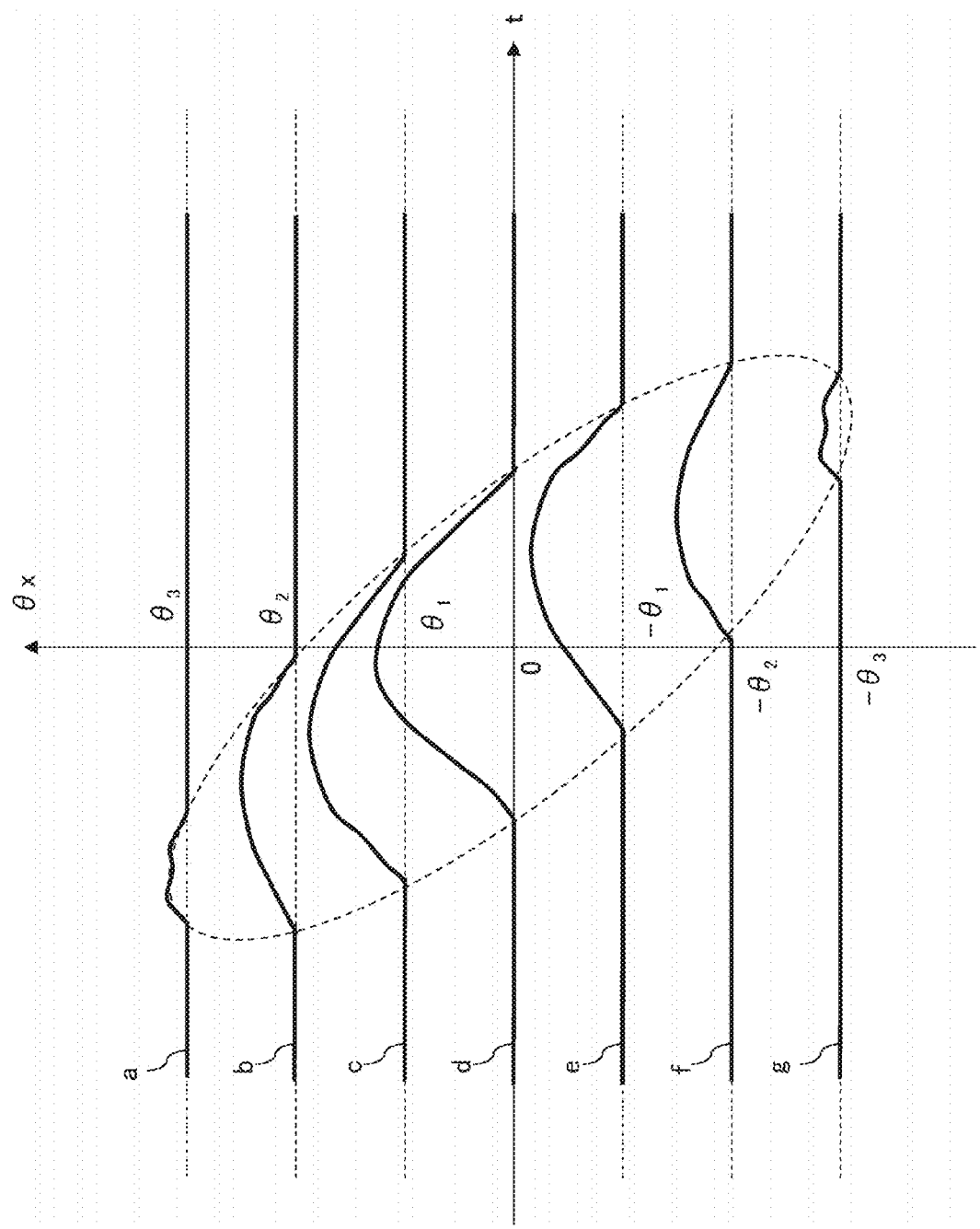
FIG. 11 is a graph that illustrates an example of time variation value for angular distribution measured by the angle detector.

FIG. 11 is a graph that illustrates an example of the time dependent value for the angular distribution measured by the angle detector 50. Waveforms "a to g" indicated in the graph correspond to the time dependent value of the current detected by the measurement circuits 56 which are connected to the plurality of collector electrodes 54a to 54g, respectively. Each of current values indicated by the waveforms "a to g" corresponds to the amount of the each of the charged particles incident into the slit 52 at a different angle θx. Therefore, measurement results by the angle detector 50 can be represented on a graph in which a horizontal axis is defined as the time t" and a vertical axis is defined as the angle θx.

Here, when the slit 52 is made to correspond to the micro region D illustrated in FIG. 4, it can be also said that the angle detector 50 measures the angular component θx of the charged particle incident into the micro region D over elapsed times t1 to t5. In FIG. 4, the relation between the elapsed time t and the central position x of the beam can be expressed as $x=\int v(t)dt$ using a scanning speed v(t) of the beam. Furthermore, in FIG. 4, since the relation between the central position x of the beam and the radial position rx of the beam corresponding to the position $x_1$ of the micro region D can be expressed as $rx=x_1-x$, the elapsed time t can be transformed into the corresponding radial position rx. Thus, "t–θx" distribution illustrated in FIG. 11 can be transformed into "rx–θx" distribution representing an "effective irradiation emittance".

Figure 12:
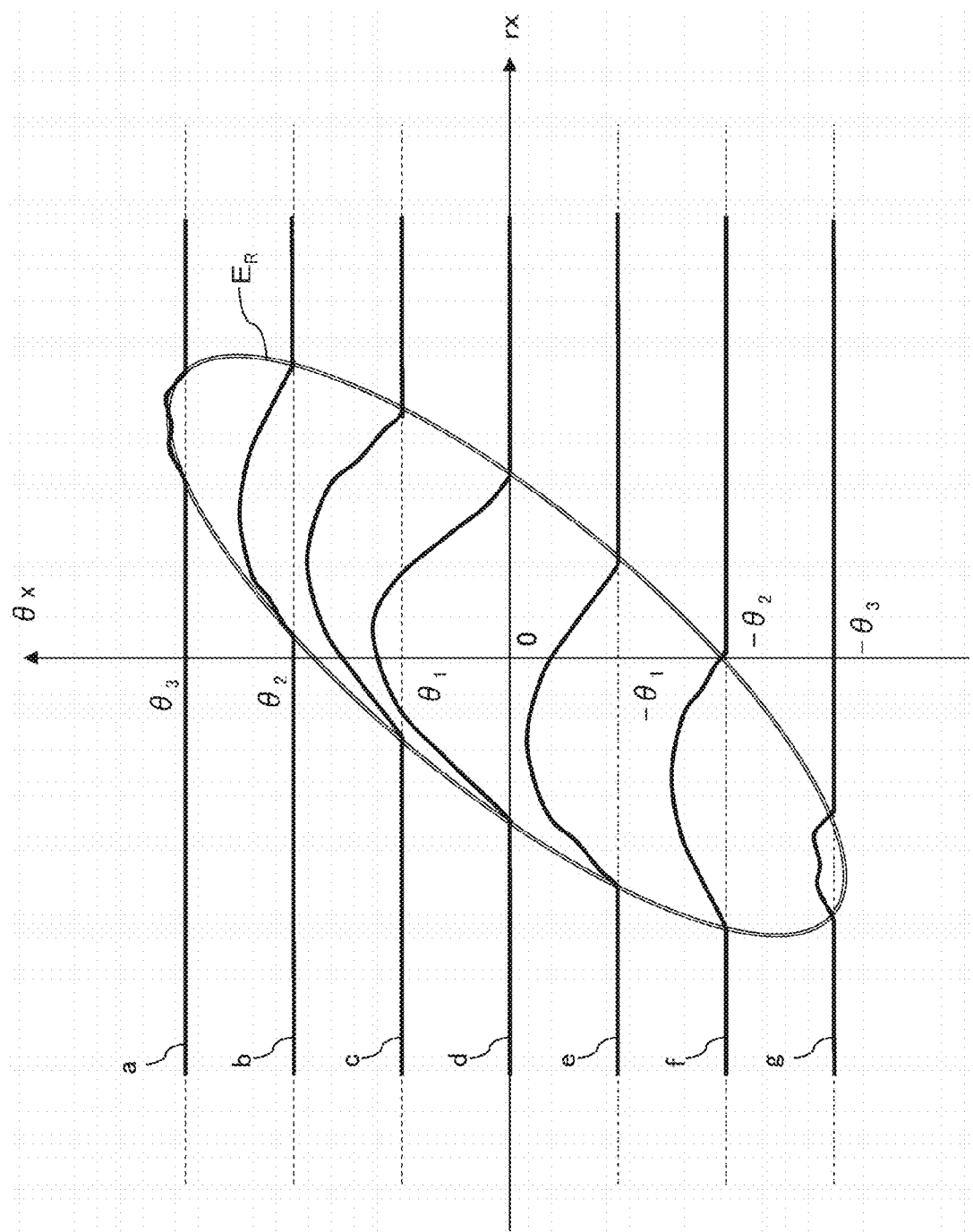
FIG. 12 is a graph that illustrates an example of an effective irradiation emittance.

FIG. 12 is a graph that illustrates an example of an effective irradiation emittance $E_R$ obtained by the transform processing of the time t to the position rx. Information on the time t included in the time dependent value for the angular distribution of the beam measured by the angle detector 50 is transformed into information on the radial position rx, and thus the effective irradiation emittance $E_R$ can be obtained. As expressed by the equation of $rx=x_1-x$ described above, since a positive-negative relation between the central position x of the beam and the radial position rx of the micro region D is opposite, the graph illustrated in FIG. 12 has a shape which is reversed right and left relative to the graph illustrated in FIG. 11. Since the effective irradiation emittance $E_R$ represents angular characteristics of the beam at the position $x_1$, it is possible to evaluate angle information, which is seen from the viewpoint of the object to be irradiated, by the effective irradiation emittance.

Figure 13:
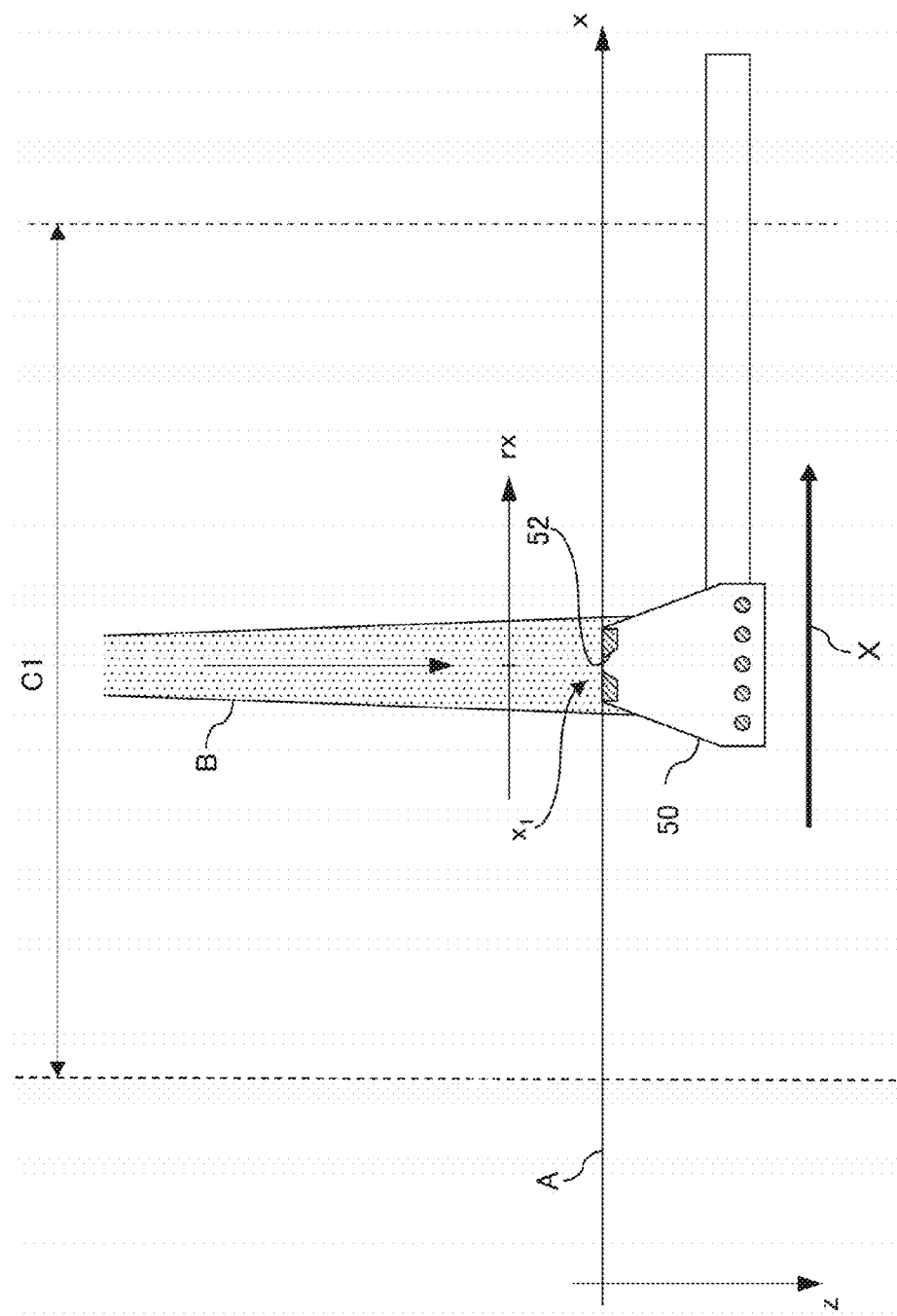
FIG. 13 is a diagram that schematically illustrates a state where a portion of a stationary charged particle beam is incident into a moving angle detector.

The angle detector 50 may be configured to measure a normal emittance. FIG. 13 is a diagram that schematically illustrates a state where a portion of a stationary charged particle beam B is incident into a moving angle detector 50. In this drawing, the charged particle beam B is fixed at a certain position $x_1$ of the beam without being scanned and the angle detector 50 moves in an X direction, which is in contrast to the state illustrated in FIG. 10. When the angle detector 50 moves in the X direction, the angular distribution in each radial position rx of the beam can be measured. In this way, the "emittance" of the charged particle beam B can be obtained.

Figure 16:
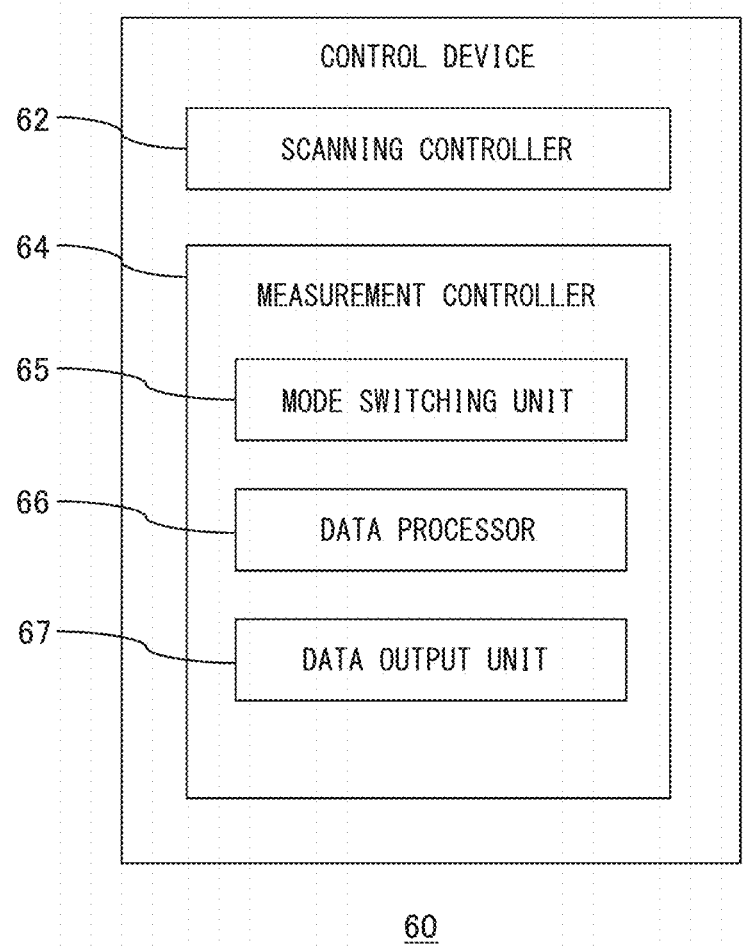
FIG. 16 is a block diagram that illustrates a functional configuration of a control device.

Subsequently, a configuration of the control device 60 that calculates the above-described effective irradiation emittance will be described. FIG. 16 is a block diagram that illustrates a functional configuration of the control device 60. The control device 60 includes a scanning controller 62 and a measurement controller 64.

Each block illustrated in the block diagram in this specification is implemented in the hardware by any CPU of a computer, other elements, or mechanical devices and in software by a computer program or the like, but FIG. 16 depicts functional blocks implemented by the cooperation of hardware and software. Thus, a person skilled in the art should appreciate that there are many ways of accomplishing these functional blocks in various forms in accordance with the components of hardware, software, or the combination of both.

The scanning controller 62 outputs a predetermined control waveform to the beam scanner 26 and allows the charged particle beam to be reciprocatively scanned in dependence upon the output control waveform. The scanning controller 62 controls a scanning cycle of the control waveform, a waveform shape, and/or the like to change a scanning condition of the charged particle beam. The scanning controller 62 generates a control waveform having a scanning cycle of, for example, about several Hz to several kHz and outputs the generated control waveform to the beam scanner 26.

The scanning controller 62 may output the control waveform such that the scanning speed v(t) becomes a constant value relative to the time t and may output the control waveform such that the scanning speed v(t) varies relative to the time t. For example, in the case where the beam intensity varies depending on the position x of the beam, when the charged particle beam is allowed to reciprocate at a constant velocity, it is possible to uniformalize the beam intensity in the x direction by making the scanning speed to be a non-constant velocity. More specifically, it is possible to uniformalize the beam intensity in the x direction by making the scanning speed faster at a position where the beam intensity is relatively high and making the scanning speed slower at a position where the beam intensity is relatively low. The scanning controller 62 generates a control waveform for achieving a non-constant scanning speed, which makes the beam intensity uniform in the x direction, using the distribution of the beam intensity measured by the intensity detector 48 and outputs the generated control waveform to the beam scanner 26.

The measurement controller 64 controls the operation of the measurement device 42 and the driving apparatus 44 to acquire beam intensity and/or angular distribution from the measurement device 42 and calculates and outputs various indices such as the effective irradiation emittance to be used for evaluating beam quality. The measurement controller 64 includes a mode switching unit 65, a data processor 66, and a data output unit 67.

The mode switching unit 65 controls the operation of the beam scanner 26, the measurement device 42, and the driving apparatus 44 and thus switches a measurement mode relevant to the angular distribution of the charged particle beam. The mode switching unit 65 provides a first measurement mode for measuring the effective irradiation emittance and a second measurement mode for measuring the emittance.

The first measurement mode is a mode where the charged particle beam is reciprocatively scanned to measure the effective irradiation emittance at the position $x_1$ which is a measurement target as illustrated in FIG. 10. Since the charged particle beam B is reciprocatively scanned by the beam scanner 26 in the first measurement mode, the time variation value for the angular distribution illustrated in FIG. 11 is acquired in a relatively short time. For example, when the beam is reciprocatively scanned at 1 kHz frequency, the charged particle beam B takes one millisecond to reciprocate the scanning range C, and thus the period required for measurement is within 0.5 miliseconds. The measurement period can be also referred to as a period required for causing the charged particle beam, which is reciprocatively scanned, to pass over the slit 52. In this specification, the period required for one measurement in the first measurement mode is also referred to as a "first period".

In the first measurement mode, the driving apparatus 44 may be driven, and thus the angle detector 50 may move from one end of the irradiation range C1 toward the other end thereof. The angle detector 50 measures the time dependent value for the angular distribution at the plurality of positions x while moving, and thus angular distribution data of the beam at the plurality of positions x is continuously acquired. For example, when the angle detector 50 moves from one end of the irradiation range C1 to the other end thereof in two seconds and thus acquires the data at the two-thousand points of position x in the irradiation range C1, it takes 1 millisecond for the angle detector 50 to move to the adjacent measurement point. Accordingly, when the charged particle beam is reciprocatively scanned at 1 kHz frequency, both forward and backward scanned beams can be measured in each of the measurement points. In this way, the angle detector 50 acquires the data while moving by the driving apparatus 44 and the data acquisition position detected by the position detector 46 is associated with the acquired data, so that the angular distribution data of the beam throughout the irradiation range C1 can be acquired in a short time.

In the first measurement mode, furthermore, the number of times of measurement at each of the measurement points may be increased by adjusting the scanning speed of the charged particle beam B and/or the moving speed of the angle detector 50. For example, when the moving speed of the angle detector 50 is reduced by half or the scanning speed is doubled by the beam scanner 26, the number of times being measurable may be increased to double. Moreover, a signal-to-noise ratio of the measurement data may be increased by summing the measurement data at the same measurement point.

In the first measurement mode, furthermore, the beam intensity may be measured using the intensity detector 48 at the same time when the angular distribution is measured using the angle detector 50. In the first measurement mode, since the measurement device 42 moves throughout the irradiation range C1, uniformity of the beam intensity can be also simultaneously measured throughout the irradiation range C1 by simultaneous measurement. By the simultaneous measurement, it is possible to shorten the period required for measuring the angular distribution and intensity of the beam compared to the case of separately measuring the angular distribution and intensity of the beam.

On the other hand, the second measurement mode is a mode where the reciprocatory scanning of the charged particle beam stops and the angle detector 50 moves in the x direction to measure the emittance of the beam where the center of the beam is located at the position $x_1$ as illustrated in FIG. 13. In the second measurement mode, the time variation value for the angular distribution of the beam is acquired while the angle detector 50 moves over a range in the rx direction corresponding to a diameter of the beam in the rx direction. Thus, in the second measurement mode, the period required for one measurement becomes relatively longer than in the first measurement mode. For example, when the rx-directional diameter of the beam is about 1/10 to 1/100 of the width of the irradiation range C1, the period required for the one measurement is about 20 to 200 miliseconds. Further, in the case of a ribbon beam where the rx-directional diameter of the beam is substantially equal to the width of the irradiation range C1, the period required for one measurement is about two seconds. The measurement period can be also referred to as a period required for causing the measurement device 42 to pass over a range in the rx direction where the charged particle beam not being reciprocatively scanned is distributed. In this specification, the period required for one measurement in the second measurement mode is also referred to as a "second period".

The mode switching unit 65 switches the operation of the beam scanner 26 and the driving apparatus 44, and also switches the period required for one measurement by the measurement device 42 between the "first period" and the "second period" when the measurement mode is changed between the first measurement mode and the second measurement mode. That is, the mode switching unit 65 switches the period required for one measurement by the measurement circuit 56 and thus the switching of the measurement mode is achieved.

The data processor 66 transforms information on the time t included in the time dependent value for the angular distribution of the beam measured by the angle detector 50 to information on the position rx and thus calculates the effective irradiation emittance and/or the emittance. When angle data of the beam is acquired in the first measurement mode, the data processor 66 transforms the time t over the "first period" to the position rx using the scanning speed v(x) of the beam at the position x of the measurement point where the data is acquired. For example, when the scanning speed v(x) of the beam is not constant, transform processing is performed using a scanning speed of a beam having a different non-constant velocity depending on the position x of the slit 52. Meanwhile, when the angle data of the beam is acquired in the second measurement mode, the data processor 66 transforms the time t over the "second period" to the position rx using the moving speed of the angle detector 50.

Figures 14A, 14B:
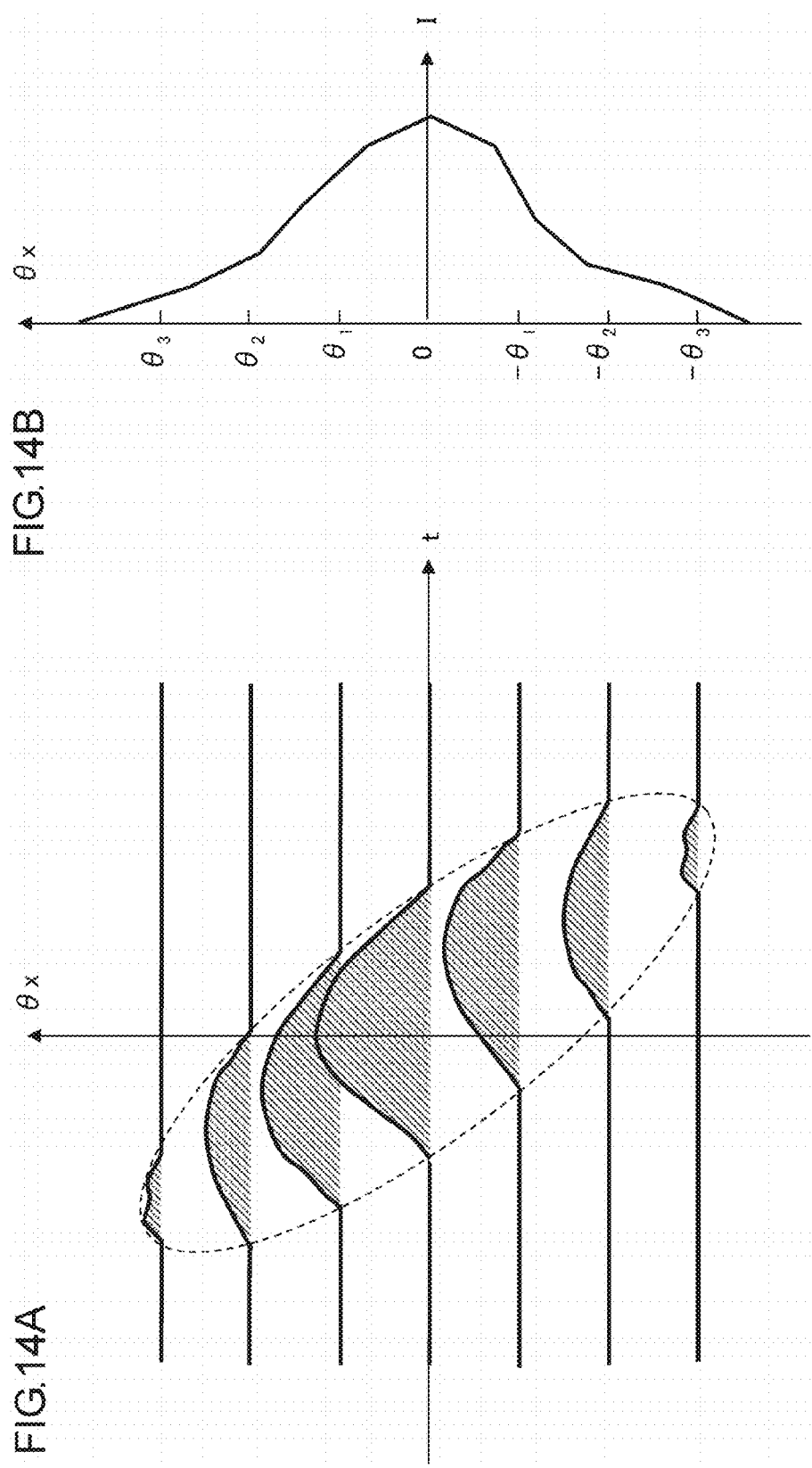
FIG. 14A is a graph that illustrates an example of time variation value for angular distribution of the charged particle beam.
FIG. 14B is a graph that illustrates an example of beam intensity distribution depending on the incident angle of the charged particle beam.

The data processor 66 may calculate beam intensity distribution depending on the incident angle of the beam by integrating the time dependent value for the angular distribution measured by the angle detector 50 with respect to time. FIG. 14A is a graph that illustrates an example of the time dependent value for the angular distribution of the charged particle beam, and FIG. 14B is a graph that illustrates an example of the beam intensity distribution depending on the incident angle of the charged particle beam. The angular intensity distribution of the beam illustrated in FIG. 14B can be obtained when time-variable integral values indicated by hatched lines in the graph of FIG. 14A are set as integrated intensity I of the beam. When the measurement circuit 56 has a function of integrating current values from the collector electrodes 54 with respect to time, the integrated current values acquired from the angle detector 50 may be referred to as the bean intensity distribution depending on the incident angle of the beam.

Figure 15:
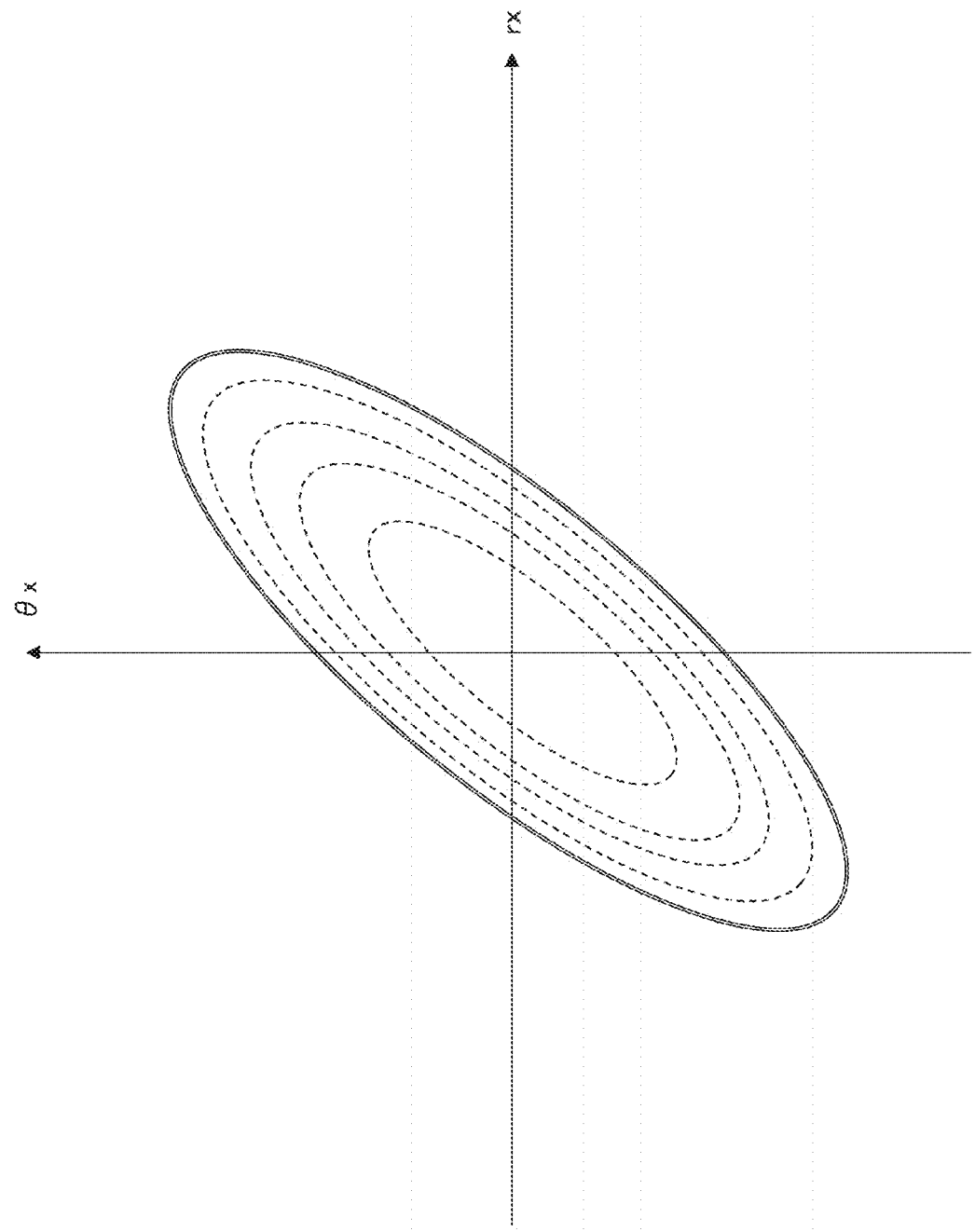
FIG. 15 is a graph that illustrates an example of beam intensity distribution within an emittance.

In addition, the data processor 66 calculates not only the effective irradiation emittance and/or the emittance but may also calculate a beam intensity distribution within the emittance. FIG. 15 is a graph that illustrates an example of the beam intensity distribution within the emittance. The beam intensity distribution is visualized as a three-dimensional graph obtained by adding an axis of the beam intensity I to an axis of the position rx and an axis of the angle θx, and a magnitude of the beam intensity I is represented by contour lines indicated by dashed lines in FIG. 15. By calculating the beam intensity distribution value within the emittance, it is possible to obtain angle information on the charged particle incident on the certain position x in more detail.

In addition, the data processor 66 may determine whether the calculated effective irradiation emittance and/or emittance satisfies predetermined conditions. For example, the data processor 66 may determine whether deviation of the angular distribution throughout the irradiation range C1 by analyzing the calculated effective irradiation emittance. When it is determined that the deviation of the angular distribution of the beam is within a predetermined value and the calculated effective irradiation emittance satisfies the predetermined conditions, the data processor 66 concludes that beam irradiation processing can be performed and then the beam irradiation apparatus may start to irradiate the processing object with the beam.

The data output unit 67 outputs data related to the effective irradiation emittance and/or the emittance calculated by the data processor 66. The data output unit 67 graphically displays the effective irradiation emittance and/or the emittance on a display device of the control device 60. For example, as illustrated in FIG. 12, the effective irradiation emittance is drawn and displayed on a coordinate system having the rx axis and the θx axis. The data output unit 67 may display a graph or the like of the beam intensity distribution of the beam and/or the beam intensity distribution within the emittance described above. In addition, the data output unit 67 may display the data itself on the display device and may also output the data itself to the outside of the control device 60.

Figure 17:
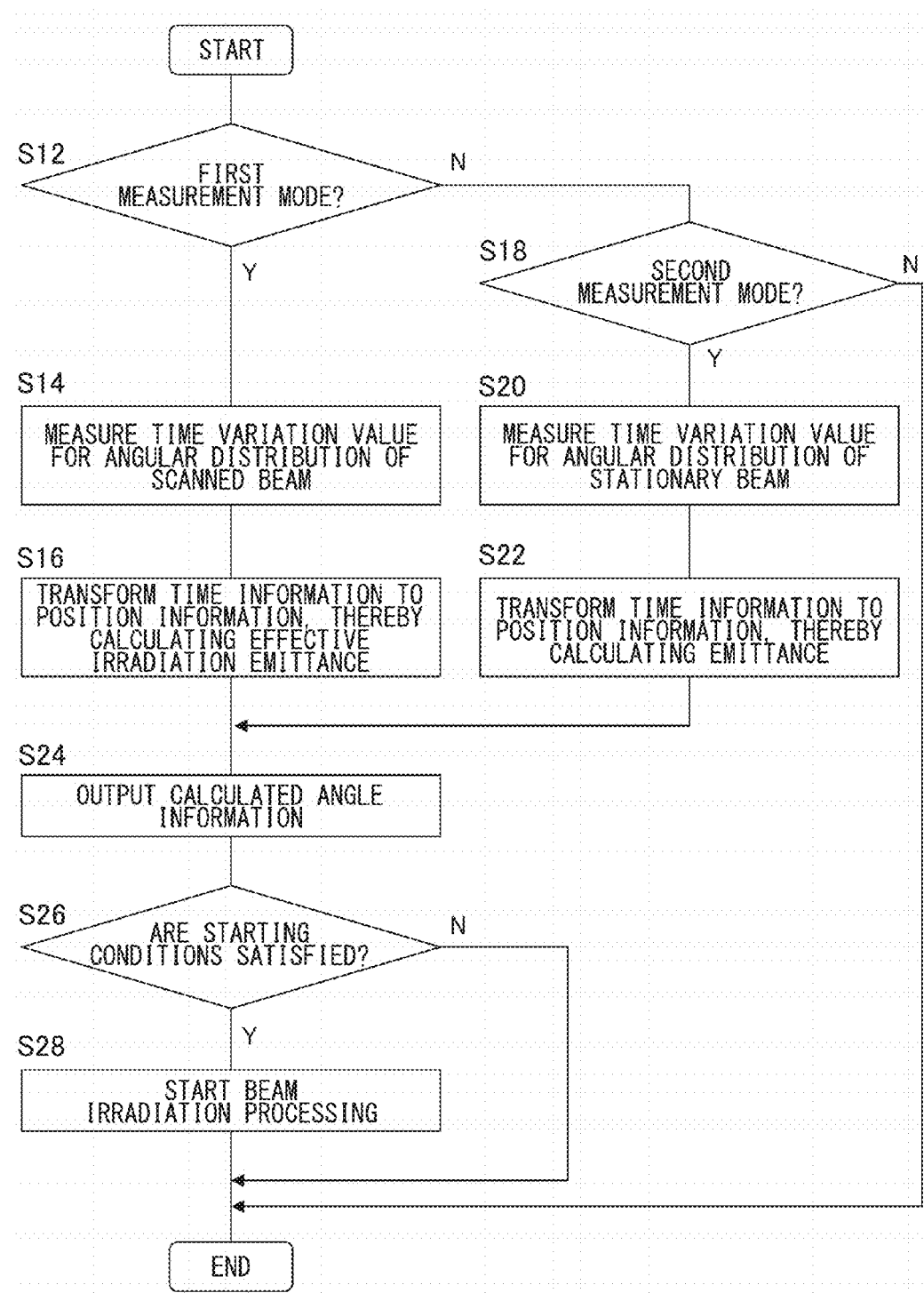
FIG. 17 is a flowchart that illustrates an operation flow of a beam irradiation apparatus.

The operation of the beam irradiation apparatus 10 with the above configurations will be described. FIG. 17 is a flowchart that illustrates an operation flow of the beam irradiation apparatus 10. When the measurement mode is the first measurement mode (Y in S12), the time dependent value for the angular distribution of the charged particle beam to be reciprocatively scanned is measured (S14) and time information on the measured angular distribution is transformed to position information to calculate the effective irradiation emittance of the scanned beam (S16). When the measurement mode is not the first measurement mode (N in S12) but is the second measurement mode (Y in S18), the time dependent value for the angular distribution of the stationary beam not being scanned is measured (S20) and time information on the measured angular distribution is transformed to position information to calculate the emittance of the stationary beam (S22). The calculated effective irradiation emittance or emittance is output (S24) and when the effective irradiation emittance or emittance satisfies starting conditions of the beam irradiation processing (Yin S26), the beam irradiation processing is started (S28). When the starting conditions of the beam irradiation processing are not satisfied (N in S26), the process of S28 is skipped and the flow is ended. In S18, furthermore, when the measurement mode is not second measurement mode (N in S18), the processes of S20 to S28 are skipped and the flow is ended.

According to the embodiment, since the angular distribution of the beam is measured while the angle detector 50 moves to the scanning direction of the beam, it is possible to measure the angle information on the beam throughout the irradiation range C1 of the beam in a short time. When the beam is scanned over the irradiation range C1, the angle detector 50 can measure the time dependent value for the angular distribution of the virtual beam bundle at the position of the slit 52, and thus it is possible to calculate the effective irradiation emittance seen from the view point of the processed object. Thus, it is possible to acquire the effective irradiation emittance throughout the irradiation range C1 before the processing object is irradiated with the beam. Therefore, it can be confirmed whether the processed object is irradiated with the appropriate beam throughout the irradiation range in advance. Accordingly, according to the embodiment, it is possible to improve the quality of the beam irradiation processing compared to the case of measuring the angle information on the beam in a spot manner.

When the charged particle beam is reciprocatively scanned by the beam scanner 26, in some cases, the angular distribution of the beam incident into the processed object may become different depending on the position of the beam due to, for example, the voltage value or the like of the parallelizing lens 30 for parallelizing the scanned beam. Since the parallelizing lens 30 changes the traveling direction of the scanned beam toward the scanning direction (x direction) to parallelize the beam, in particular, the x-directional angular distribution is easily changed depending on the position of the beam. For example, in the case of the process of implanting ions into a semiconductor wafer, the form of the ion implantation may vary depending on the x-directional position on the wafer due to the variation in the angular distribution, and thus there is a concern that the ions are not uniformly implanted into the entire wafer. As a result, a device yield may be reduced.

In the embodiment, since the scanning-directional (x-directional) angular distribution which is liable to variation depending on the x-directional position of the beam in the case of using the scanned beam is measured, it is possible to confirm the uniformity of the angular distribution of the beam in the scanning direction before the processed object is irradiated with the beam. If the uniformity of the angular distribution of the beam is not sufficient, it is possible to improve the uniformity of the angular distribution of the beam, for example, by changing the setting of the beamline device 14 in advance. This makes it possible to improve the quality of the beam irradiation processing.

In the embodiment, furthermore, the uniformity of the angular distribution of the beam and the uniformity of the beam intensity can be simultaneously measured. In order to uniformly irradiate the entire processed object with the beam, it is important to uniformalize not only the angular distribution of the beam but also the beam intensity. In the embodiment, since the angular distribution and the intensity of the beam can be measured at the same time, it is possible to shorten the measurement time compared to the case of separately measuring each of them. Thus, the measurement time prior to the beam irradiation can be shortened and the beam irradiation apparatus 10 can be improved in productivity.

In the embodiment, furthermore, since the first measurement mode and the second measurement mode are prepared as the measurement modes for the angular distribution of the beam, the angular distribution of both the scanned beam and the stationary beam can be also measured. Therefore, it is possible to obtain not only the angle information seen from the viewpoint of the processing object but also the angle information on the beam itself. In another embodiment, only one of either the first measurement mode or the second measurement mode may be prepared.

The invention has been described above with reference to the aforementioned respective embodiments, but the invention is not limited to the aforementioned respective embodiments, and variations in which each component of the embodiments is appropriately combined or substituted are also encompassed by the invention. In addition, appropriate changes of the combinations or the orders of the processes in the aforementioned embodiments can be made and various modifications, such as design modifications, can be made with respect to the aforementioned embodiments, based on the knowledge of those skilled in the art. Such modified embodiments can also be included in the scope of the invention.

The above embodiment illustrated the case where the angle detector 50 can be configured to measure the angular distribution in the x direction. In another embodiment, the angle detector 50 may be configured to measure the angular distribution in the y direction. For example, the angle detector 50 may include a narrow slit which has an opening extended in the x direction and a plurality of collector electrodes which are disposed to be spaced from one another in the y direction. In addition, the angle detector 50 may be configured to measure the angular distribution in both of the x direction and the y direction. For example, the angle detector 50 may include an x-directional detector capable of measuring x-directional angular distribution and a y-directional detector capable of measuring y-directional angular distribution.

It should be understood that the invention is not limited to the above-described embodiment, but may be modified into various forms on the basis of the spirit of the invention. Additionally, the modifications are included in the scope of the invention.

What is claimed is:

1. A beam irradiation apparatus that is configured to irradiate a processed object with a charged particle beam, comprising:
    a beam scanner that is configured such that the charged particle beam is reciprocatively scanned in a predetermined scanning direction;
    a measurement device that is capable of measuring an angular component of charged particles incident into a region of a measurement target; and
    a data processor that calculates an effective irradiation emittance of the charged particle beam using results measured by the measurement device,
    wherein the measurement device measures a time dependent value for angular distribution of the charged particle beam for a period during which the charged particle beam to be reciprocatively scanned in the scanning direction passes over the region of the measurement target and is incident into the measurement device,
    the data processor transforms time information included in the time depending value for the angular distribution measured by the measurement device to position information and thus calculates the effective irradiation emittance, and
    the effective irradiation emittance represents an emittance of a virtual beam bundle in the scanning direction, the virtual beam bundle being formed by summing portions of the charged particle beam which are incident into the region of the measurement target with being scanned in the scanning direction.

2. The beam irradiation apparatus according to claim 1, further comprising a driving apparatus that is configured such that the measurement device moves in the scanning direction and thus the region of the measurement target is movable in the scanning direction,
    wherein the measurement device measures the time dependent value for the angular distribution of the charged particle beam which is reciprocatively scanned while the measurement device moves in the scanning direction, and
    the data processor transforms time information included in the time dependent value for the angular distribution measured by the measurement device to position information in the scanning direction and thus calculates the effective irradiation emittance.

3. The beam irradiation apparatus according to claim 2, wherein the driving apparatus allows the measurement device to be capable of moving over an irradiation range in the scanning direction of the charged particle beam and includes a position detector that is capable of detecting a position of the measurement device in the scanning direction, and
    the data processor calculates the effective irradiation emittance depending on the position of the measurement device detected by the position detector.

4. The beam irradiation apparatus according to claim 3, wherein the measurement device measures the time dependent value for the angular distribution at a plurality of positions in the scanning direction over the irradiation range of the charged particle beam, and
    the data processor calculates the effective irradiation emittance at the plurality of positions in the scanning direction over the irradiation range of the charged particle beam.

5. The beam irradiation apparatus according to claim 2, further comprising a mode switching unit that controls an operation of the beam scanner and the driving apparatus and thus switches a measurement mode relevant to the angular distribution of the charged particle beam,
    wherein the mode switching unit includes:
        a first measurement mode that allows the charged particle beam to be reciprocatively scanned by the beam scanner and allows time dependent value for angular distribution of a charged particle beam, which is reciprocatively scanned in the scanning direction, to be measured using the measurement device; and a second measurement mode that allows the reciprocatory scanning of the charged particle beam to stop by the beam scanner, allows the measurement device to move in the scanning direction, and thus allows time dependent value for angular distribution of a charged particle beam not being reciprocatively scanned to be measured using the measurement device, and the data processor calculates the effective irradiation emittance in the first measurement mode and calculates emittance of the charged particle beam not being reciprocatively scanned in the second measurement mode.

6. The beam irradiation apparatus according to claim 5, wherein the first measurement mode performs measurement using the measurement device for a first period required for causing the charged particle beam to be reciprocatively scanned to pass over the region of the measurement target using the measurement device, the second measurement mode performs measurement using the measurement device for a second period required for allowing the measurement device to pass over a range in the scanning direction of the charged particle beam not being reciprocatively scanned in the scanning direction using the measurement device, and the mode switching unit is configured such that a measurement period of the measurement device is changed to the second period relatively longer than the first period to switch from the first measurement mode to the second measurement mode.

7. The beam irradiation apparatus according to claim 1, wherein data processor transforms the time information to the position information using a scanning speed in the scanning direction when the charged particle beam passes over the region of the measurement target.

8. The beam irradiation apparatus according to claim 7, wherein the beam scanner reciprocatively scans the charged particle beam with a non-constant scanning speed such that the scanning speed varies depending on the position in the scanning direction, and the data processor transforms the time information to the position information using the non-constant scanning speed.

9. The beam irradiation apparatus according to claim 1, wherein the beam scanner reciprocatively scans the charged particle beam with a predetermined scanning cycle, and the measurement device performs a plurality of measurement operations on the time dependent value for the angular distribution in synchronization with the scanning cycle.

10. The beam irradiation apparatus according to claim 9, wherein the data processor calculates the effective irradiation emittance by synthesizing the time dependent values for the angular distribution obtained by performing the plurality of measurement operations in synchronization with the scanning cycle.

11. The beam irradiation apparatus according to claim 1, wherein the measurement device measures the time dependent value for the angular distribution over the irradiation range of the charged particle beam, measures beam intensity of the charged particle beam over the irradiation range of the charged particle beam, and calculates uniformity of the beam intensity in the scanning direction.

12. The beam irradiation apparatus according to claim 1, further comprising a data output unit that outputs results calculated by the data processor, wherein the data output unit visualizes the calculated effective irradiation emittance on a coordinate system having an axis in the scanning direction and an axis of the angular component.

13. The beam irradiation apparatus according to claim 1, wherein the measurement device includes:

a slit that has an opening extended in a direction intersecting with the scanning direction and partitions the region of the measurement target; and a plurality of collector electrodes that has a shape which is thin and extended in the intersection direction and are juxtaposed to each other in the scanning direction and are located away from the slit in a beam traveling direction, and wherein the measurement device detects charged particles passing through the slit using the plurality of collector electrodes and thus measures the time dependent value for the angular distribution.

14. The beam irradiation apparatus according to claim 13, wherein the plurality of collector electrodes is longer in the intersection direction than the slit.

15. The beam irradiation apparatus according to claim 13, wherein the measurement device is configured such that a front surface of the slit is disposed at a position corresponding to a beam irradiation plane of the processed object in the beam traveling direction to measure the time dependent value for the angular distribution of a charged particle beam passing through the beam irradiation plane.

16. The beam irradiation apparatus according to claim 13, wherein the measurement device has a faraday cup that is used to measure beam intensity of the charged particle in addition to the collector electrodes used to measure the time dependent value for the angular distribution, and the faraday cup is configured to be disposed at the position corresponding to the beam irradiation plane of the processed object in the beam traveling direction.

17. The beam irradiation apparatus according to claim 13, wherein the measurement device further includes a measurement circuit that is connected to the plurality of collector electrodes and is configured to separately measure time dependent values of currents which are detected by the plurality of collector electrodes respectively, and the data processor calculates the effective irradiation emittance using the time dependent values of the currents which are detected by the plurality of collector electrodes respectively.

18. The beam irradiation apparatus according to claim 17, wherein the measurement circuit is configured such that an integrated current amount is measurable, the integrated current amount being capable of being obtained by integrating the time dependent values of the currents which are detected by the plurality of collector electrodes respectively, for a constant period, and the data processor calculates the angular distribution of the charged particle beam in the scanning direction using the integrated current amount.

19. The beam irradiation apparatus according to claim 1, wherein the data processor calculates the angular distribution of the charged particle beam in the scanning direction by integrating the time dependent value for the angular distribution, which is measured by the measurement device, with respect to time.

20. The beam irradiation apparatus according to claim 18, further comprising a data output unit that outputs results calculated by the data processor,
  wherein the output unit visualizes the calculated angular distribution on a coordinate system having an axis indicating beam intensity of the charged particle beam and an axis of the angular component.

21. The beam irradiation apparatus according to claim 1, wherein the data processor determines whether the calculated effective irradiation emittance satisfies a predetermined condition and starts to irradiate the processed object with the charged particle beam when determining to satisfy the predetermined conditions.

22. A beam irradiation method of irradiating a processed object with a charged particle beam, comprising:
  scanning the charged particle beam reciprocatively in a predetermined scanning direction;
  measuring time dependent value for angular distribution of the charged particle beam, by using a measurement device capable of measuring an angular component of charged particles incident on a region of a measurement target, for a period in which the charged particle beam to be reciprocatively scanned in the scanning direction passes over the region of the measurement target and is incident into the measurement device; and transforming time information included in the measured time dependent value for the angular distribution to position information and calculating effective irradiation emittance of the charged particle beam, wherein the effective irradiation emittance represents an emittance of a virtual beam bundle in the scanning direction, the virtual beam bundle being formed by summing portions of the charged particle beam which are incident into the region of the measurement target with being scanned in the scanning direction.

* * * * *